(12) United States Patent
Park et al.

(10) Patent No.: US 11,705,386 B2
(45) Date of Patent: Jul. 18, 2023

(54) SEMICONDUCTOR DEVICE INCLUDING TSV AND METHOD OF MANUFACTURING THE SAME

(71) Applicant: Samsung Electronics Co., Ltd., Suwon-si (KR)

(72) Inventors: Kwang Wuk Park, Seoul (KR); Sung Dong Cho, Hwaseong-si (KR); Eun Ji Kim, Seoul (KR); Hak Seung Lee, Seoul (KR); Dae Suk Lee, Suwon-si (KR); Dong Chan Lim, Hwaseong-si (KR); Sang Jun Park, Yongin-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 17/651,456

(22) Filed: Feb. 17, 2022

(65) Prior Publication Data

US 2022/0173016 A1 Jun. 2, 2022

Related U.S. Application Data

(63) Continuation of application No. 16/678,620, filed on Nov. 8, 2019, now Pat. No. 11,289,402.

(30) Foreign Application Priority Data

Feb. 22, 2019 (KR) .................. 10-2019-0021085
May 29, 2019 (KR) .................. 10-2019-0063263

(51) Int. Cl.
*H01L 23/48* (2006.01)
*H01L 21/48* (2006.01)

(52) U.S. Cl.
CPC ........ *H01L 23/481* (2013.01); *H01L 21/4814* (2013.01)

(58) Field of Classification Search
CPC .................... H01L 21/4814; H01L 23/481
USPC ............................................. 257/744
See application file for complete search history.

(56) References Cited

U.S. PATENT DOCUMENTS

| | | | |
|---|---|---|---|
| 6,251,791 B1 | 6/2001 | Tsai et al. |
| 7,629,255 B2 | 12/2009 | Fu et al. |
| 8,518,282 B2 | 8/2013 | Lee et al. |
| 8,546,256 B2 | 10/2013 | Jung et al. |
| 8,658,531 B2 | 2/2014 | Yang et al. |
| 8,921,199 B1 | 12/2014 | Erickson et al. |
| 9,048,299 B2 | 6/2015 | Ting et al. |
| 9,245,824 B2 | 1/2016 | Jahnes et al. |
| 2007/0178694 A1 | 8/2007 | Hiatt |

(Continued)

FOREIGN PATENT DOCUMENTS

| KR | 20020072984 A | 9/2002 |
|---|---|---|
| KR | 100833421 B1 | 5/2008 |

(Continued)

*Primary Examiner* — Monica D Harrison
(74) *Attorney, Agent, or Firm* — Myers Bigel, P.A.

(57) ABSTRACT

A semiconductor device includes a substrate, an interlayer insulating layer on the substrate, a first etch stop layer on the substrate, a first through-silicon-via (TSV) configured to pass vertically through the substrate and the interlayer insulating layer, and a second TSV configured to pass vertically through the substrate, the interlayer insulating layer, and the first etch stop layer, wherein the second TSV has a width greater than that of the first TSV.

20 Claims, 27 Drawing Sheets

(56) References Cited

U.S. PATENT DOCUMENTS

| | | |
|---|---|---|
| 2009/0051039 A1 | 2/2009 | Kuo et al. |
| 2011/0115047 A1 | 5/2011 | Hebert et al. |
| 2017/0053872 A1 | 2/2017 | Lee et al. |
| 2018/0053797 A1 | 2/2018 | Lee et al. |
| 2019/0198426 A1* | 6/2019 | Choi .................. H01L 21/3212 |

FOREIGN PATENT DOCUMENTS

| | | |
|---|---|---|
| KR | 20090110568 A | 10/2009 |
| KR | 1020150019089 A | 2/2015 |
| KR | 1020180020361 A | 2/2018 |

* cited by examiner

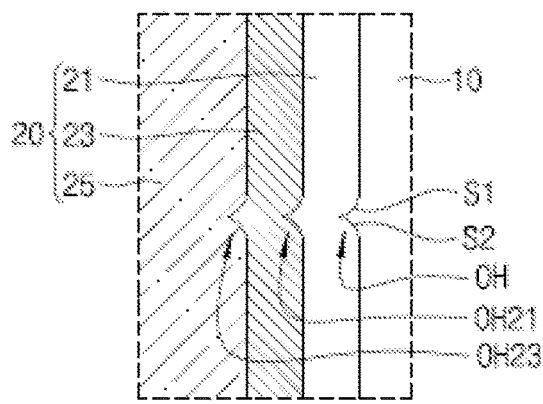
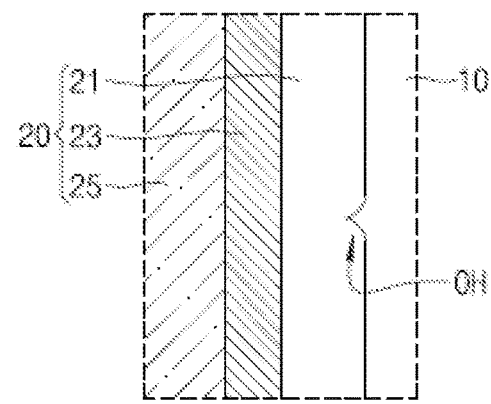
FIG. 37A  FIG. 37B
FIG. 38
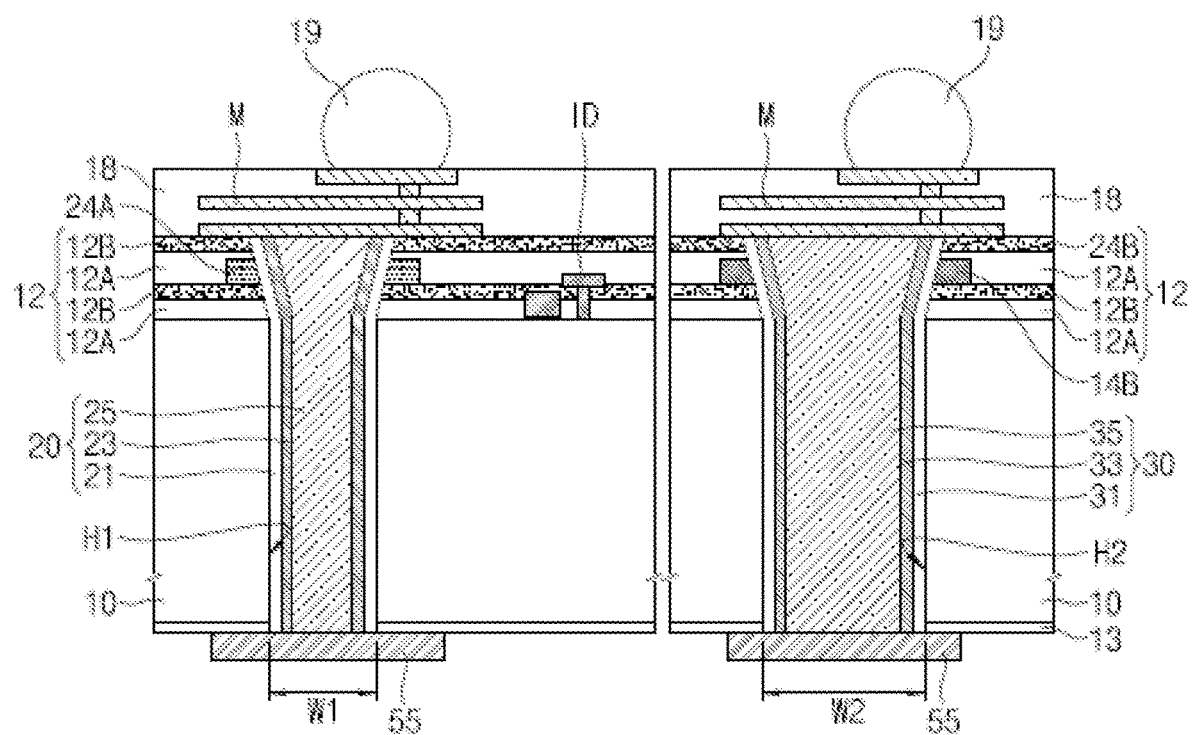

SEMICONDUCTOR DEVICE INCLUDING TSV AND METHOD OF MANUFACTURING THE SAME

CROSS-REFERENCE TO RELATED APPLICATION

This application is a continuation of U.S. patent application Ser. No. 16/678,620, filed Nov. 8, 2019, which claims the benefit of and priority to Korean Patent Application No. 10-2019-0021085, filed on Feb. 22, 2019, and Korean Patent Application No. 10-2019-0063263, filed on May 29, 2019, the disclosures of which are hereby incorporated herein by reference in their entireties.

BACKGROUND

1. Field

Devices and methods consistent with example embodiments relate to semiconductor devices including a through-silicon-via (TSV) and methods of manufacturing the same.

2. Description of Related Art

The development of a three-dimensional (3D) package in which a plurality of semiconductor chips is mounted in one semiconductor device is ongoing. As a result, techniques for a through-silicon-via (TSV), which passes through a substrate or die to form a vertical electrical connection, are expected to be an important part of the development of 3D packages.

Conventionally, TSVs are formed to have the same widths (or diameter). However, as semiconductor devices are becoming miniaturized and highly integrated, there may be a need to reduce widths (or diameter) of some of the TSVs.

SUMMARY

The example embodiments of the inventive concept are directed to providing a semiconductor device including through-silicon-vias (TSVs) having two or more different sizes.

In addition, the example embodiments of the inventive concept are directed to providing a method of manufacturing a semiconductor device including TSVs having two or more different sizes.

According to example embodiments, there is provided a semiconductor device that includes a substrate, an interlayer insulating layer on the substrate, a etch adjusting layer on the substrate, a first through-silicon-via (TSV) configured to pass through the substrate, the interlayer insulating layer, and the etch adjusting layer, and a second TSV configured to pass through the substrate and the interlayer insulating layer, wherein the first TSV and the second TSV have different widths, and the etch adjusting layer comprises a material having a different etch selectivity with respect to the interlayer insulating layer and the substrate.

According to example embodiments, there is provided a semiconductor device that includes a substrate, an interlayer insulating layer on the substrate, a first etch adjusting layer and a second etch adjusting layer on the substrate, a first through-silicon-via (TSV) configured to pass through the substrate, the interlayer insulating layer, and the first etch adjusting layer, and a second TSV configured to pass through the substrate, the interlayer insulating layer, and the second etch adjusting layer, wherein the second TSV has a width greater than that of the first TSV, and the first etch adjusting layer and the second etch adjusting layer comprise first and second materials, respectively, having different respective etch selectivities with respect to the interlayer insulating layer and the substrate, and wherein the first material of the first etch adjusting layer has a higher etch rate with respect to the interlayer insulating layer and the substrate, and wherein the second material of the second etch adjusting layer has a lower etch rate with respect to the interlayer insulating layer and the substrate.

According to example embodiments, there is provided a semiconductor device that includes a substrate, an interlayer insulating layer on the substrate, a etch adjusting layer on the substrate, a first through-silicon-via (TSV) configured to pass through the substrate and the interlayer insulating layer, and a second TSV configured to pass through the substrate, the interlayer insulating layer and the etch adjusting layer, wherein the second TSV has a width greater than that of the first TSV, and wherein the etch adjusting layer comprises a material having a lower etch rate with respect to the interlayer insulating layer and the substrate.

BRIEF DESCRIPTION OF THE DRAWINGS

The above and other objects and features of the present inventive concept will become more apparent to those of ordinary skill in the art by describing example embodiments thereof in detail with reference to the accompanying drawings, in which:

FIGS. 37A and 37B are enlarged views of a region A of FIG. 36 according to example embodiments.

FIGS. 38 to 43 are cross-sectional views that illustrate a configuration of a part of semiconductor devices according to example embodiments of the inventive concept.

DETAILED DESCRIPTION

The inventive concept will now be described more fully with reference to the accompanying drawings, in which example embodiments of the inventive concept are shown. As used herein, the term "and/or" includes any and all combinations of one or more of the associated listed items. It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination.

Figure 1:
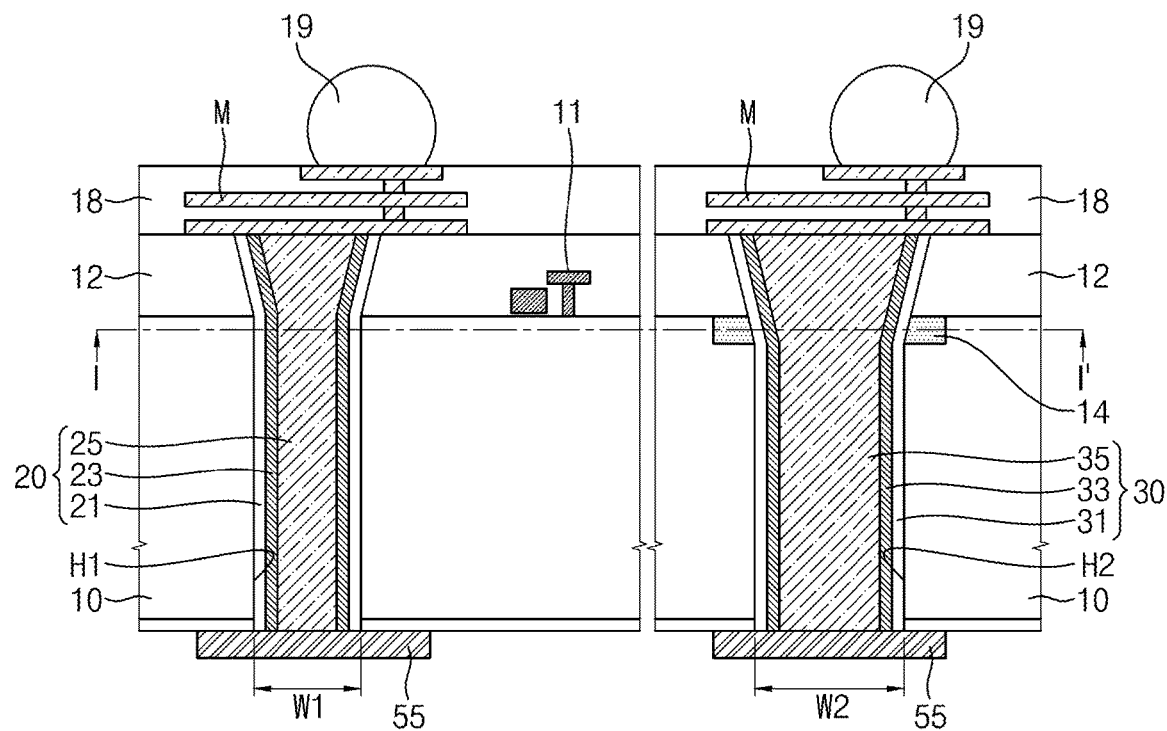
FIG. 1 is a cross-sectional view that illustrates a configuration of a part of a semiconductor device according to an example embodiment of the inventive concept.
Figure 2:
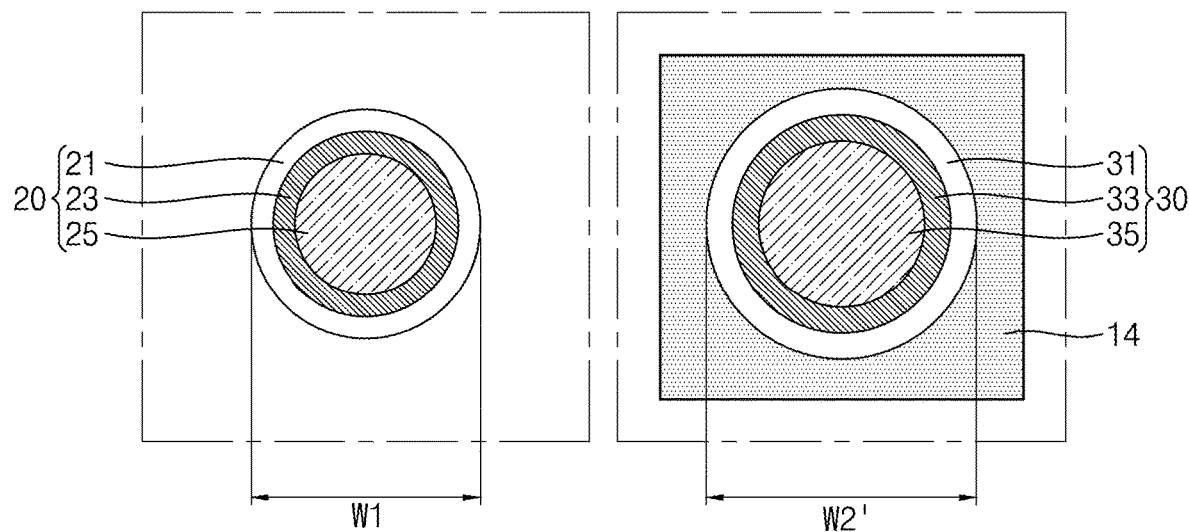
FIG. 2 is a plan view taken along line I-I' of FIG. 1.

FIG. 1 is a cross-sectional view that illustrates a configuration of a part of a semiconductor device according to an example embodiment of the inventive concept. FIG. 2 is a plan view taken along line I-I' of FIG. 1.

Referring to FIGS. 1 and 2, the semiconductor device may include a substrate 10, an etch stop layer 14 disposed in the substrate 10, an interlayer insulating layer 12 disposed on the substrate 10, a metal interlayer insulating layer 18 disposed on the interlayer insulating layer 12, through-silicon-vias (TSVs) 20 and 30 passing through the substrate 10 and the interlayer insulating layer 12, a metal layer M disposed in the metal interlayer insulating layer 18, and connection terminals 19 disposed on the metal interlayer insulating layer 18.

The substrate 10 may include one or more semiconductor materials, such as silicon (Si) or germanium (Ge), or one or more compound semiconductor materials, such as silicon carbide (SiC), gallium arsenide (GaAs), indium arsenide (InAs), or indium phosphide (InP). The substrate 10 may have a silicon-on-insulator (SOI) structure. The substrate 10 may include a buried oxide (BOX) layer. The substrate 10 may include a conductive region, for example, a well doped with an impurity or a structure doped with an impurity. In addition, the substrate 10 may have various device isolation structures, such as a shallow trench isolation (STI) structure.

The interlayer insulating layer 12 may be disposed on the substrate 10. In an example embodiment, the interlayer insulating layer 12 may be an interlayer insulating layer included in a front-end-of-line (FEOL) structure formed on the substrate. In other embodiments, the interlayer insulating layer 12 may include an interlayer insulating layer included in a FEOL structure formed on the substrate 10 and an interlayer insulating layer included in a back-end-of-line (BEOL) structure formed on the FEOL structure.

The TSVs 20 and 30 may be disposed in through-holes H1 and H2 passing vertically through the substrate 10 and the interlayer insulating layer 12. The TSVs 20 and 30 may be in contact with inner sidewalls of the substrate 10 and the interlayer insulating layer 12, which define the through-holes H1 and H2. In an example embodiment, through-holes having different sizes, e.g., widths or diameters, may be formed in the substrate 10 and the interlayer insulating layer 12. For example, the through-holes may include a first through-hole H1 and a second through-hole H2 having a greater width or diameter than the first through-hole H1.

In an example embodiment, the TSVs 20 and 30 may include a first TSV 20 and a second TSV 30 having different sizes in accordance with the different sizes of the first through-hole H1 and the second through-hole H2. The first TSV 20 may be disposed in the first through-hole H1, and the second TSV 30 may be disposed in the second through-hole H2. The first TSV 20 may have a first width W1 in the substrate 10 and the second TSV 30 may have a second width W2, which is greater than the first width W1 in the substrate 10. The second TSV 30 may have a width that is greater than that of the first TSV 20 even in the interlayer insulating layer 12.

The first TSV 20 may include a first via insulating layer 21, a first barrier layer 23, and a first plug 25. The first via insulating layer 21, the first barrier layer 23, and the first plug 25 constituting the first TSV 20 may extend vertically in the first through-hole H1 to pass through the substrate 10 and the interlayer insulating layer 12. An outer sidewall of the first via insulating layer 21 may be in contact with the substrate 10 and the interlayer insulating layer 12. The first via insulating layer 21 may serve to separate the substrate 10 and the interlayer insulating layer 12 from the first TSV 20. For example, the first via insulating layer 21 may be made of an oxide film, a nitride film, a carbide film, a polymer, or a combination thereof. An atomic layer deposition (ALD) process or a chemical vapor deposition (CVD) process may be used to form the first via insulating layer 21.

The first barrier layer 23 may be at least partially surrounded by the first via insulating layer 21. The first barrier layer 23 may be a conductive layer having a relatively low line resistance. For example, the first barrier layer 23 may be a single layer or multiple layers including at least one material selected from among W, WN, Ti, TiN, Ta, TaN, and Ru. The first barrier layer 23 may be formed using a physical vapor deposition (PVD) process or a CVD process. In other embodiments, the first barrier layer 23 may be formed using an ALD process.

The first plug 25 may be at least partially surrounded by the first barrier layer 23. The first plug 25 may include a metal different from that of the first barrier layer 23. For example, the first plug 25 may include one or more materials, including, but not limited to materials, such as Cu, W, CuSn, CuMg, CuNi, CuZn, CuPd, CuAu, and/or CuW.

The second TSV 30 may include a second via insulating layer 31, a second barrier layer 33, and a second plug 35. In an example embodiment, the second via insulating layer 31 may have the same material and the same thickness as the first via insulating layer 21. The second barrier layer 33 may have the same material and the same thickness as the first barrier layer 23. The second plug 35 may have the same material as the first plug 25 and may have a width greater than that of the first plug 25.

The etch stop layer 14 may at least partially surround a portion of an outer sidewall of the second TSV 30. In an example embodiment, the etch stop layer 14 may be disposed in the substrate 10 and an upper surface thereof and an upper surface of the substrate 10 may be substantially coplanar. The upper surface of the etch stop layer 14 may be in physical contact with a lower surface of the interlayer insulating layer 12. For example, the etch stop layer 14 may include one or more materials, including, but not limited to materials, such as a SiN-based material, an oxide-based material, a Si-based material (e.g., SiGe), a metal-based material, and/or a carbon-based material.

The etch stop layer 14 may have a polygonal shape in a plan view. For example, as shown in FIG. 2, the etch stop layer 14 may have a rectangular shape. In other embodiments, the etch stop layer 14 may have a circular shape. In addition, in FIG. 2, the first TSV 20 and the second TSV 30 are shown as having a circular cross-sectional shape, but embodiments of the inventive concept are not limited thereto. For example, planar structures of the first TSV 20 and/or the second TSV 30 may have various cross-sectional shapes, such as a polygonal shape, an elliptical shape, and the like.

A conductive layer 55 connected to the TSVs 20 and 30 may be disposed on a back surface of the substrate 10.

Figure 3:
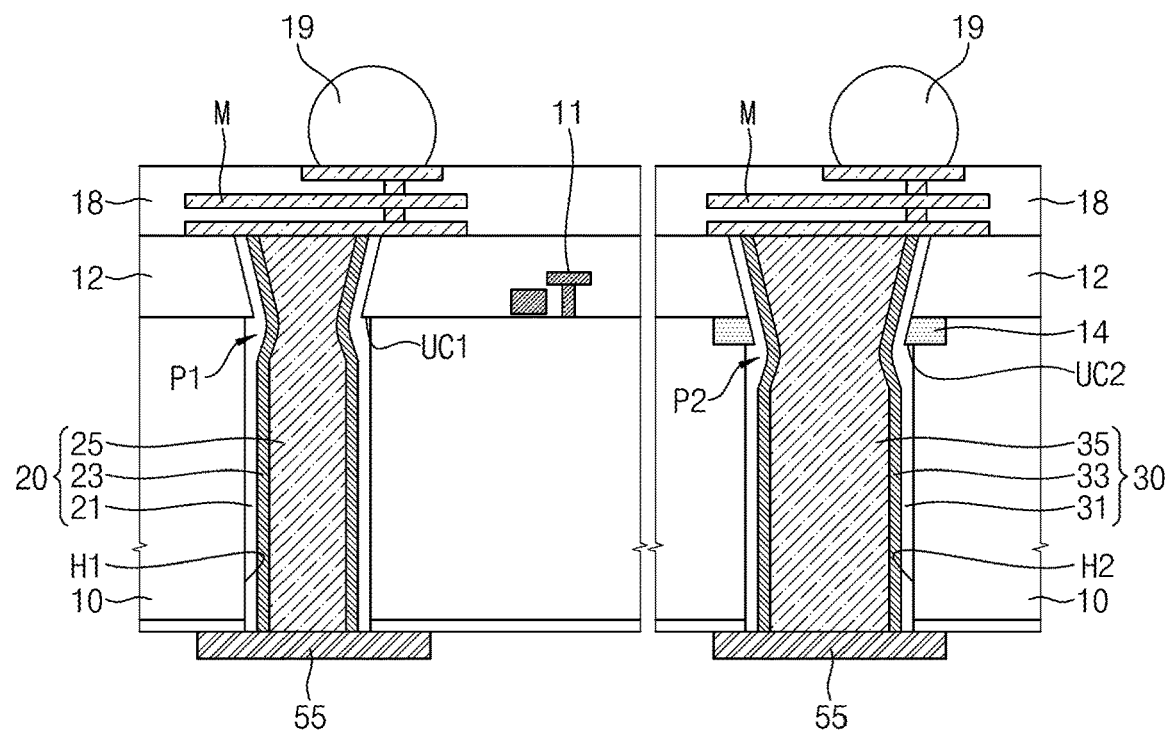
FIG. 3 is a cross-sectional view that illustrates a configuration of a part of a semiconductor device according to an example embodiment of the inventive concept.

FIG. 3 is a cross-sectional view that illustrates a configuration of a part of a semiconductor device according to an example embodiment of the inventive concept. In FIGS. 1 to 3, like reference numerals denote like elements. Hereinafter, to simplify the explanation, substantially the same or similar content as that described with reference to FIGS. 1 and 2 will be omitted.

Referring to FIG. 3, a first through-hole H1 may include a first undercut region UC1 formed below an interlayer insulating layer 12 in a region in which a substrate 10 and the interlayer insulating layer 12 are adjacent to each other. A second through-hole H2 may include a second undercut region UC2 formed below an etch stop layer 14 in a region in which the substrate 10 and the etch stop layer 14 are adjacent to each other.

A first via insulating layer 21 may include a first protrusion P1, which at least partially fills the first undercut region UC1 in the first through-hole H1 and is in physical contact with a lower surface of the interlayer insulating layer 12. A thickness of the first protrusion P1 in a lateral direction may be greater than a thickness of other portions of the first via insulating layer 21 in the lateral direction.

A second via insulating layer 31 may include a second protrusion P2, which at least partially fills the second undercut region UC2 in the second through-hole H2 and is in physical contact with a lower surface of the etch stop layer 14. The second protrusion P2 may be located at a different height from the first protrusion P1. For example, the second protrusion P2 may be located farther away from the interlayer insulating layer 12 than the first protrusion P1 and disposed close to a back surface of the substrate 10 in a vertical view. A thickness of the second protrusion P2 in the lateral direction may be greater than a thickness of other portions of the second via insulating layer 31 in the lateral direction.

Figure 4:
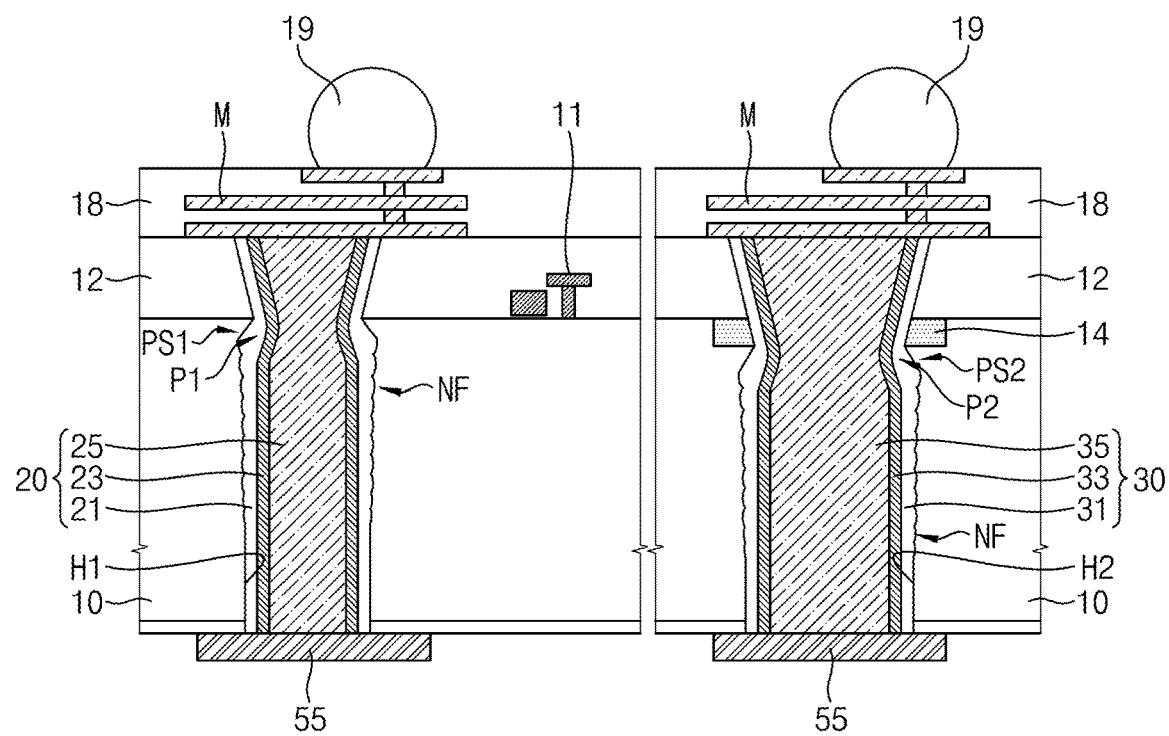
FIG. 4 is a cross-sectional view that illustrates a configuration of a part of a semiconductor device according to an example embodiment of the inventive concept.

FIG. 4 is a cross-sectional view that illustrates a configuration of a part of a semiconductor device according to an example embodiment of the inventive concept. In FIGS. 1 to 4, like reference numerals denote like elements. Hereinafter, to simplify the explanation, substantially the same or similar content as that described with reference to FIGS. 1 to 3 will be omitted.

Referring to FIG. 4, non-flat portions NF may be formed at sidewalls of a substrate 10 that define TSVs 20 and 30. Each of the via insulating layers 21 and 31 may have a non-flat portion having a shape corresponding to that of the non-flat portion NF while being in physical contact with the non-flat portion NF included in the sidewall of the substrate 10. The non-flat portion NF formed at the sidewall of the substrate 10 may be formed during a process of forming through-holes H1 and H2 in the substrate 10. In an example embodiment, the through-holes H1 and H2, which are defined by the sidewall including the non-flat portion NF may be formed using a Bosch process. For example, to form the through-holes H1 and H2 in the substrate 10, an inductive coupled plasma deep reactive-ion etching (ICP DRIE) process using $SF_6$ or $O_2$ plasma and a sidewall passivation process using any one of $CF_x$ series, such as $C_4F_8$ and the like, may be repeated several times.

In an example embodiment, sizes of uneven portions formed in the non-flat portion NF, which is formed at the sidewall of the substrate 10, and sizes of uneven portions formed in the non-flat portions, which are formed at the via insulating layers 21 and 31 may be reduced in a direction from a lower surface of an interlayer insulating layer 12 to a back surface of the substrate 10. For example, the non-flat portion NF formed at the sidewall of the substrate 10 may be formed in a region of the substrate 10, which is adjacent to the interlayer insulating layer 12, and a portion of the non-flat portion NF, which is adjacent to the back surface of the substrate 10, may have a flat surface.

The substrate 10, which defines TSVs 20 and 30, may include protrusions PS1 and PS2, which extend to inner sides of the TSVs 20 and 30 from portions thereof adjacent to the interlayer insulating layer 12. The protrusion PS1 may be interposed between the interlayer insulating layer 12 and a first protrusion P1 of a first via insulating layer 21, and the interlayer insulating layer 12 and the first protrusion P1 of the first via insulating layer 21 may not be in physical contact with each other. In addition, the protrusion PS2 may be interposed between an etch stop layer 14 and a second protrusion P2 of a second via insulating layer 31, and the interlayer insulating layer 12 and the second protrusion P2 of the second via insulating layer 31 may not be in physical contact with each other.

Figure 5:
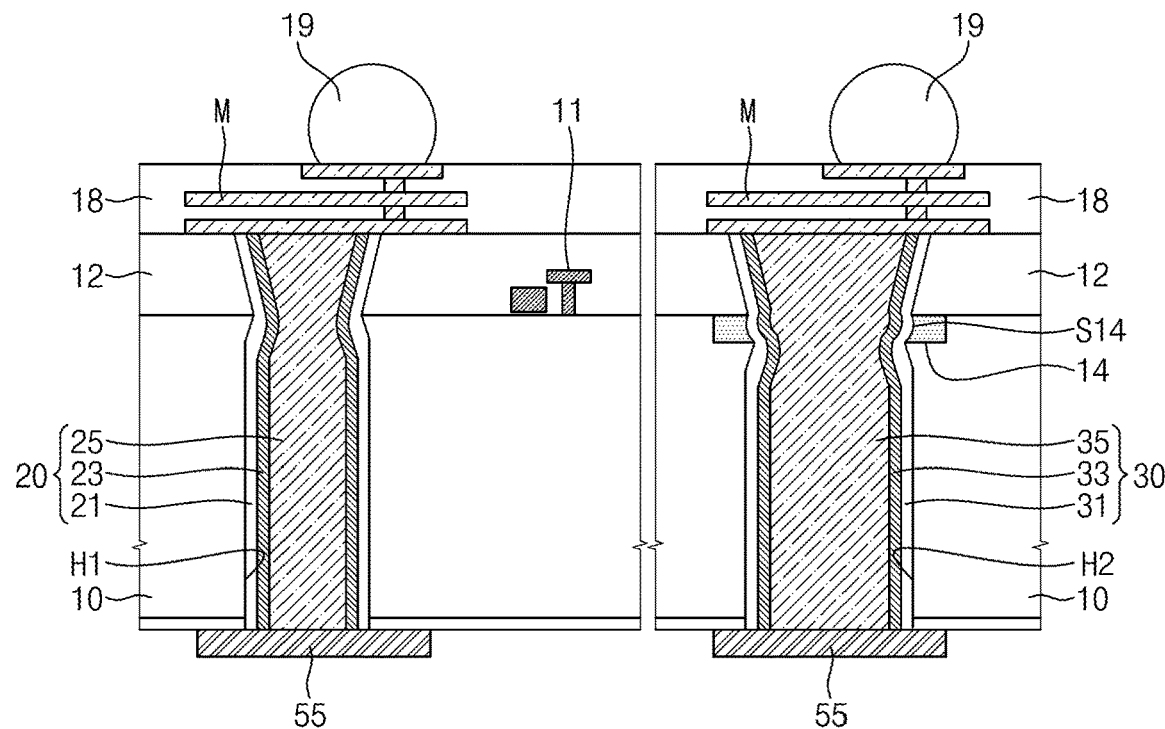
FIG. 5 is a cross-sectional view that illustrates a configuration of a part of a semiconductor device according to an example embodiment of the inventive concept.

FIG. 5 is a cross-sectional view that illustrates a configuration of a part of a semiconductor device according to an example embodiment of the inventive concept. In FIGS. 1 to 5, like reference numerals denote like elements. Hereinafter, to simplify the explanation, substantially the same or similar content as that described with reference to FIGS. 1 to 4 will be omitted.

Referring to FIG. 5, an inner sidewall S14 of an etch stop layer 14, which at least partially surrounds a second TSV 30, may be concavely recessed in an inward direction of the second TSV 30. A second via insulating layer 31 may include a convex portion of which a portion in contact with the recessed inner sidewall S14 of the etch stop layer 14 protrudes in the outward direction of the second TSV 30. A convex portion may be formed at a portion of a second barrier layer 33 which is in physical contact with the convex portion of the second via insulating layer 31. A convex portion may be formed at a portion of a second plug 35 which is in physical contact with the convex portion of the second barrier layer 33.

Figure 6:
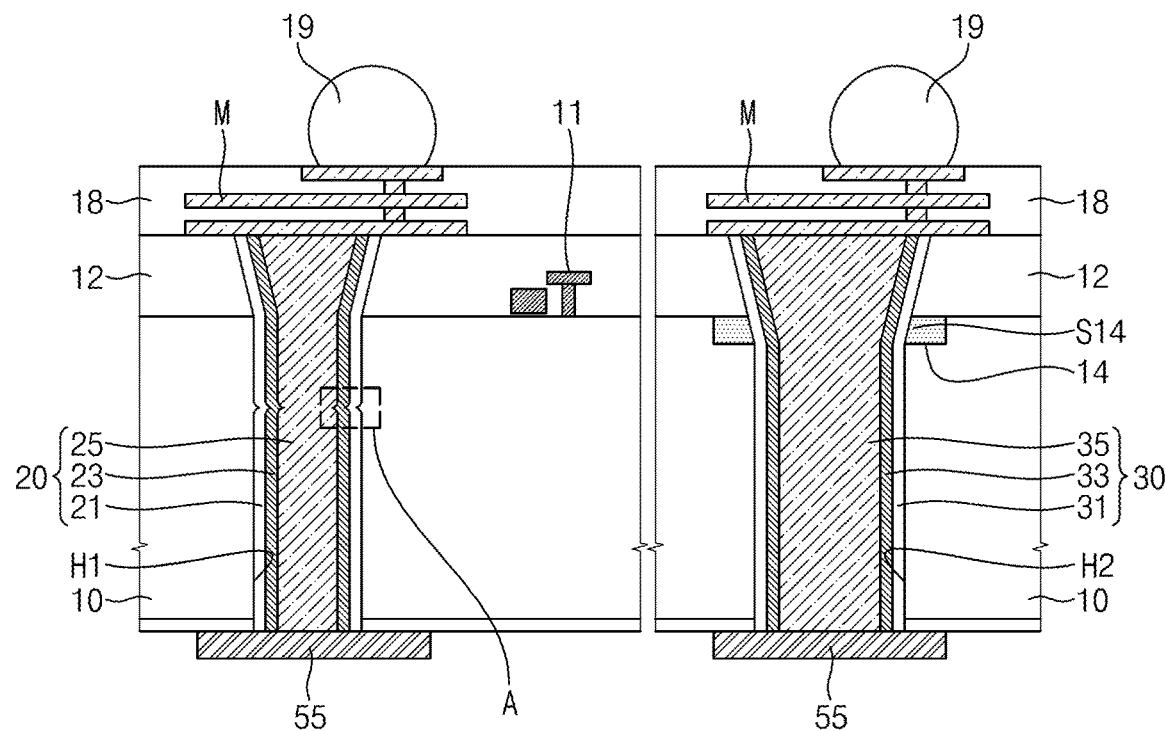
FIG. 6 is a cross-sectional view that illustrates some configurations of a semiconductor device according to an example embodiment of the inventive concept.

FIG. 6 is a cross-sectional view that illustrates some configurations of a semiconductor device according to an example embodiment of the inventive concept. FIGS. 7 to 10 are enlarged views of a region A of FIG. 6 according to example embodiments. In FIGS. 1 to 10, like reference numerals denote like elements. Hereinafter, to simplify the explanation, substantially the same or similar content as that described with referenced to FIGS. 1 to 5 will be omitted.

Figure 7:
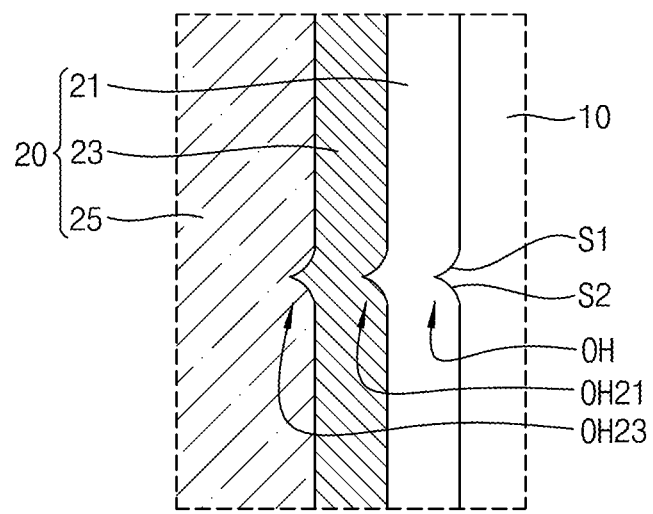
FIGS. 7 to 10 are enlarged views of a region A of FIG. 6 according to example embodiments.
Figure 8:
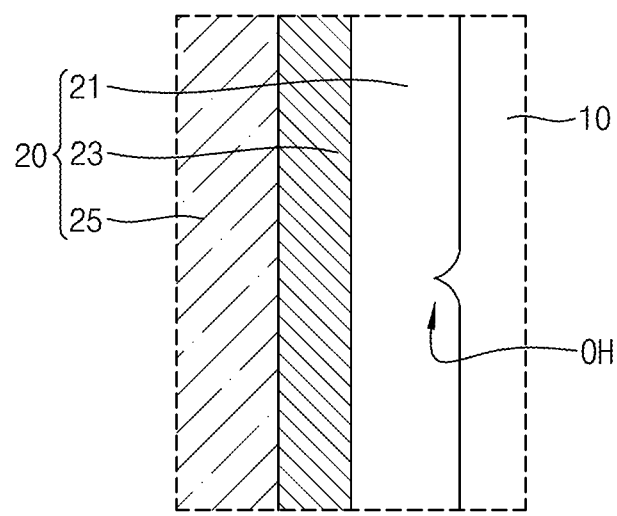

Referring to FIGS. 6 to 8, an overhang OH may be formed at a sidewall of a substrate 10 that at least partially surrounds a first TSV 20. The overhang OH may include a first inclined surface 51 which extends in an inward direction of the first TSV 20 from the sidewall of the substrate 10 toward a back surface of the substrate 10 and a second inclined surface S2 which extends in the inward direction of the first TSV 20 from the sidewall of the substrate 10 toward an upper surface of the substrate 10. An outer side surface of a first via insulating layer 21 may include a recessed portion corresponding to the overhang OH while being in physical contact with the overhang OH formed at the sidewall of the substrate 10.

In an example embodiment, an inner side surface of the first via insulating layer 21 may include an overhang OH21 which extends in the inward direction of the first TSV 20 at a level, e.g., a vertical level in cross-sectional view, corresponding to that of the recessed portion. An outer side surface of a first barrier layer 23 may include a recessed portion corresponding to the overhang OH21 while being in physical contact with the overhang OH21 of the first via insulating layer 21. In the same manner as described above, an overhang OH23 may be formed at an inner side surface of the first barrier layer 23 and a recessed portion may be formed at an outer side surface of a first plug 25. However, embodiments of the inventive concept are not limited thereto. A first via insulating layer 21 and a first barrier layer 23 may not include overhangs OH21 and OH23 even when a substrate 10 includes an overhang OH as shown in FIG. 8.

Figure 9:
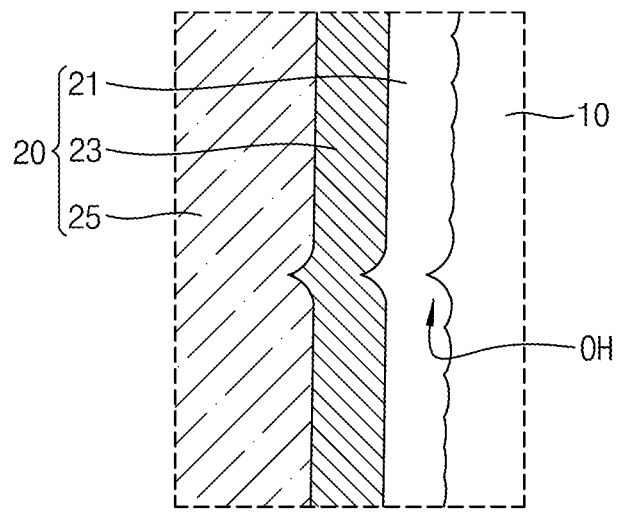

Referring to FIGS. 6 and 9, uneven portions including convex portions may be formed at the sidewall of the substrate 10, which at least partially surrounds the first TSV 20. An overhang OH formed at the sidewall of the substrate 10 may be any one of the convex portions, which form uneven portions. In an example embodiment, the overhang OH formed at the sidewall of the substrate 10 may be the largest one of the convex portions.

Figure 10:
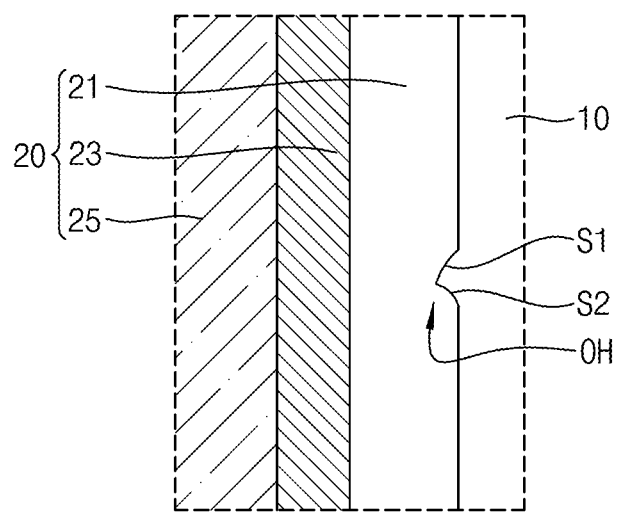

Referring to FIG. 10, an overhang OH formed at the sidewall of the substrate 10, which at least partially surrounds the first TSV 20, may include a first inclined surface S1 having a cross-section, which is convex in a direction approaching a first plug 25, and a second inclined surface S2 having a cross-section, which is concave in a direction away from the first plug 25.

Figure 11:
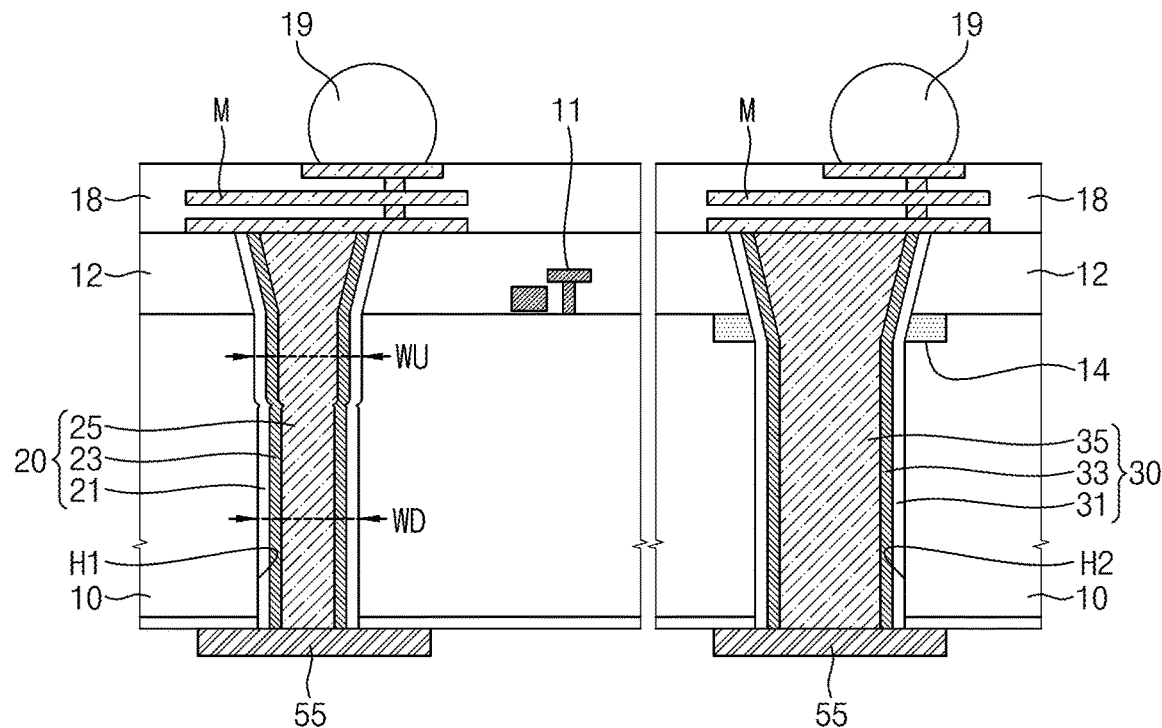
FIGS. 11 and 12 are cross-sectional views that illustrate a configuration of a part of semiconductor devices according to example embodiments of the inventive concept.
Figure 12:
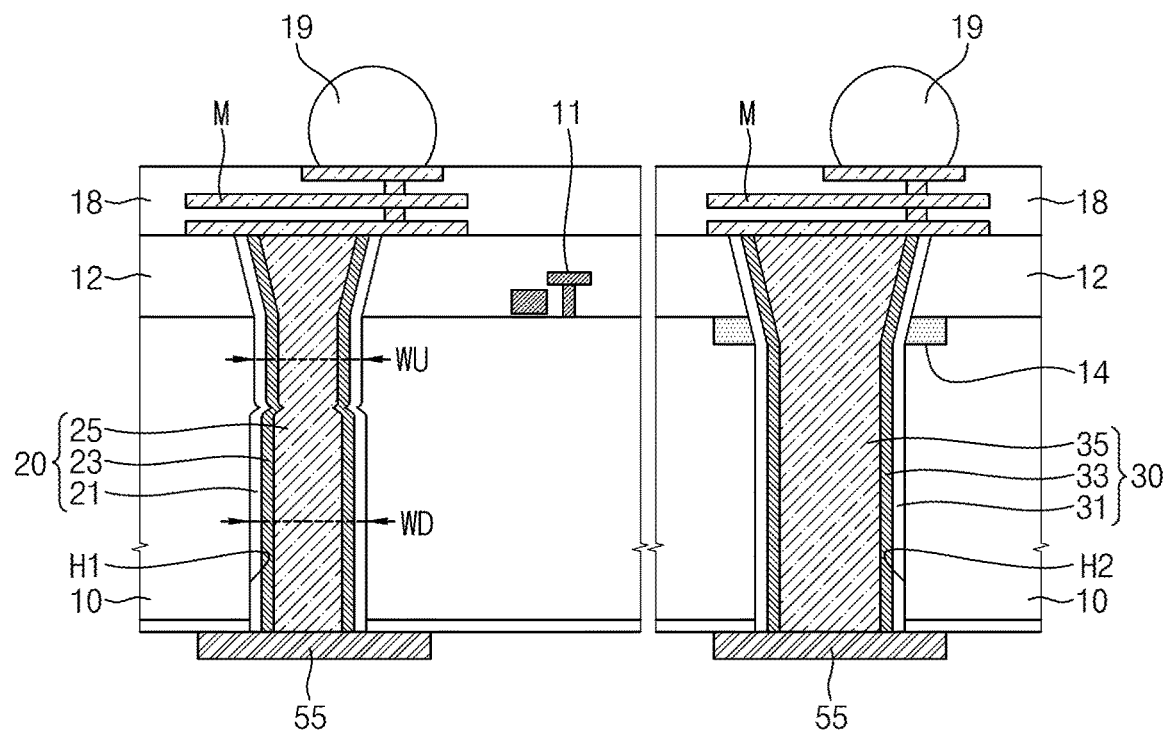

FIGS. 11 and 12 are cross-sectional views that illustrate a configuration of a part of semiconductor devices according to example embodiments of the inventive concept. In FIGS. 1 to 12, like reference numerals denote like elements. Hereinafter, to simplify the explanation, substantially the same or similar content as that described with reference to FIGS. 1 to 10 will be omitted.

Referring to FIG. 11, a first TSV 20 may have a width WU at an upper side of an overhang OH greater than a width WD at a lower side of the overhang OH. In other embodiments, referring to FIG. 12, a first TSV 20 may have a width WU at an upper side of an overhang OH less than a width WD at a lower side of the overhang OH.

FIGS. 13 to 16 are cross-sectional views that illustrate a configuration of a part of semiconductor devices according to example embodiments of the inventive concept. In FIGS. 1 to 16, like reference numerals denote like elements. Hereinafter, to simplify the explanation, substantially the same or similar content as that described with reference to FIGS. 1 to 12 will be omitted.

Figure 13:
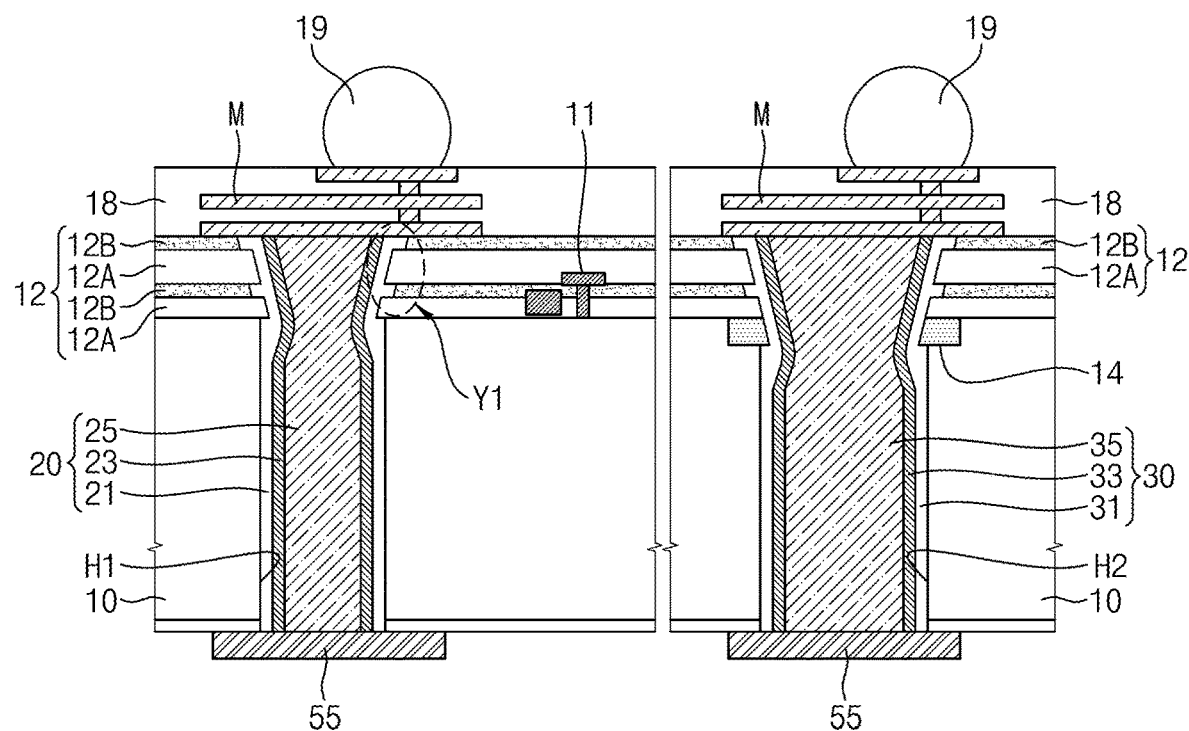
FIGS. 13 to 16 are cross-sectional views that illustrate a configuration of a part of semiconductor devices according to example embodiments of the inventive concept.

Referring to FIG. 13, an interlayer insulating layer 12 may include a plurality of insulating layers 12A and 12B, which are stacked on a substrate 10. In an example embodiment, a first interlayer insulating layer 12A and a second interlayer insulating layer 12B may be alternately stacked on the substrate 10. For example, in FIG. 13, a case of having a four-layer structure including four insulating layers is shown, but embodiments of the inventive concept are not limited thereto, and the number of layers to be stacked is not particularly limited.

For example, the first interlayer insulating layer 12A may include a tetraethyl orthoilicate (TEOS) film, a high-density plasma (HDP), borophosphosilicate glass (BPSG), a flowable chemical vapor deposition (FCVD) oxide, or an ultralow-k (ULK) material having an ultra-low dielectric constant k of about 2.2 to 2.4. The ULK material may be made of, for example, SiOC or SiCOH. The second interlayer insulating layer 12B may include silicon nitride (SiN) or silicon oxynitride (SiON). However, embodiments of the inventive concept are not limited to the example embodiments described above.

In an example embodiment, an end portion of the first interlayer insulating layer 12A and an end portion of the second interlayer insulating layer 12B, which are in physical contact with a first TSV 20 and a second TSV 30, may be located at different levels, i.e., vertical positions in cross-sectional view. For example, the end portion of the first interlayer insulating layer 12A may be located closer to outer sidewalls of barrier layers 23 and 33 than the end portion of the second interlayer insulating layer 12B. Accordingly, a sidewall of the interlayer insulating layer 12, which is in physical contact with the TSVs 20 and 30, may have an uneven shape Y1.

When the sidewall of the interlayer insulating layer 12 includes the uneven shape Y1, via insulating layers 21 and 31 in physical contact with the interlayer insulating layer 12 may include a non-flat surface having a shape corresponding to the uneven shape Y1.

Figure 14:
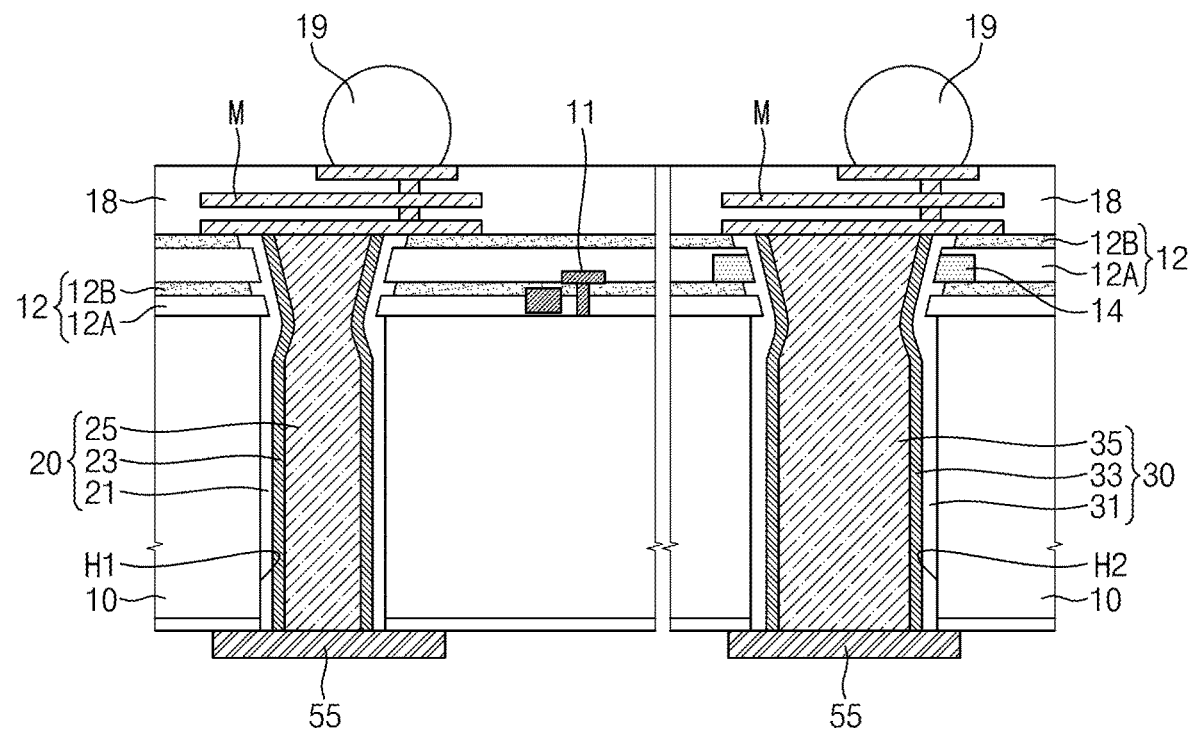

Referring to FIG. 14, an etch stop layer 14 may be disposed in an interlayer insulating layer 12. In an example embodiment, the etch stop layer 14 may be located at the same level, i.e., vertical level in cross-sectional view, as a first interlayer insulating layer 12A. For example, a lower surface of the etch stop layer 14 may be in physical contact with an upper surface of the second interlayer insulating layer 12B and may be substantially coplanar with a lower surface of the first interlayer insulating layer 12A.

In an example embodiment, a thickness of the etch stop layer 14 may be less than a thickness of the first interlayer insulating layer 12A or may substantially correspond to the thickness of the first interlayer insulating layer 12A. However, embodiments of the inventive concept are not limited thereto, and the thickness of the etch stop layer 14 may be greater than the interlayer insulating layer 12A and less than a thickness of the interlayer insulating layer 12A in various embodiments. In other embodiments, the thickness of the etch stop layer 14 may substantially correspond to the thickness of the interlayer insulating layer 12A.

Figure 15:
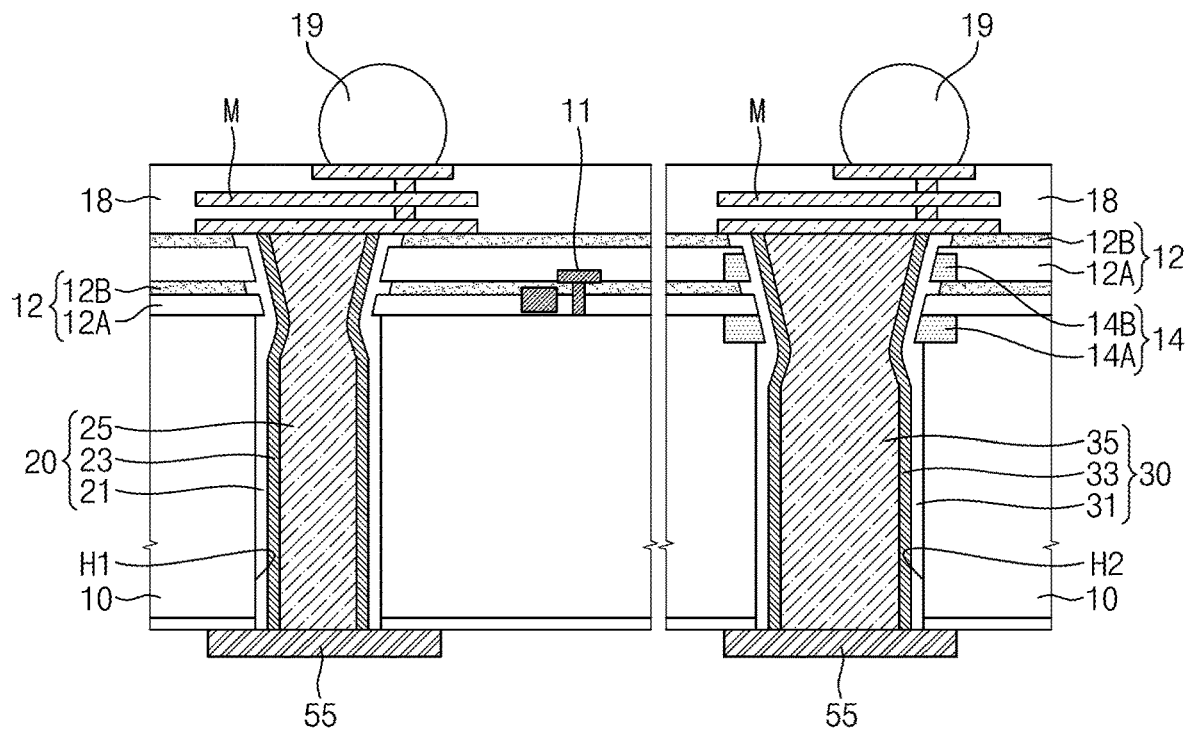
Figure 16:
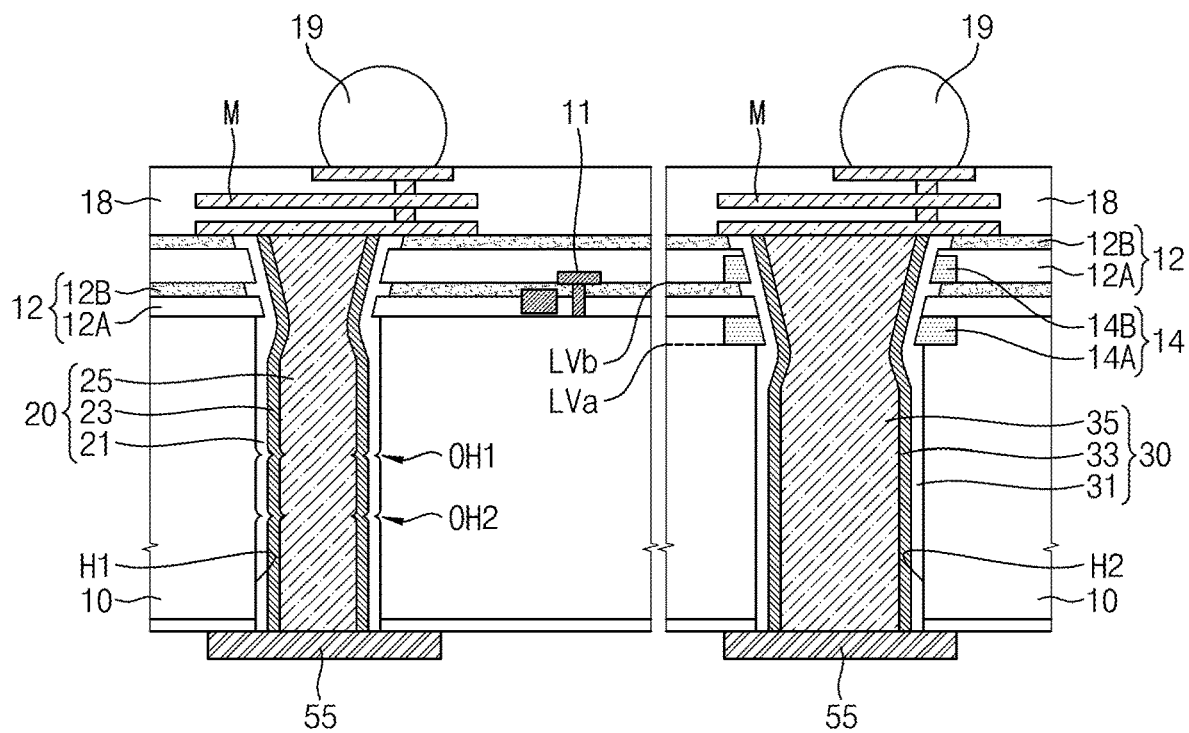

FIGS. 15 and 16 are cross-sectional views that illustrate a configuration of a part of semiconductor devices according to example embodiments of the inventive concept. In FIGS. 1 to 16, like reference numerals denote like elements. Hereinafter, to simplify the explanation, substantially the same or similar content as that described with reference to FIGS. 1 to 14 will be omitted.

Referring to FIG. 15, an etch stop layer 14 may include a plurality of insulating layers, which are formed to be vertically spaced apart, in cross-sectional view, from each other. The etch stop layer 14 may include a first etch stop layer 14A and a second etch stop layer 14B. In an example embodiment, the first etch stop layer 14A may be disposed in a substrate 10 and the second etch stop layer 14B may be disposed in an interlayer insulating layer 12.

Referring to FIG. 16, when the etch stop layer 14 includes a plurality of insulating layers, a plurality of overhangs OH may be formed at a sidewall of a substrate 10, which at least partially surrounds a first TSV 20. In an example embodiment, when the etch stop layer 14 includes two insulating layers, two overhangs OH may be formed at the sidewall of the substrate 10, which at least partially surrounds the first TSV 20. The overhangs OH may include a first overhang OH1 located at an upper portion thereof and a second overhang OH2 located at a lower portion thereof.

In an example embodiment, a vertical distance in cross-sectional view between the first overhang OH1 and the second overhang OH2 may be substantially equal to a vertical distance (LVa–LVb) between a lower surface of the first etch stop layer 14A and a lower surface of the second etch stop layer 14B.

Figure 17:
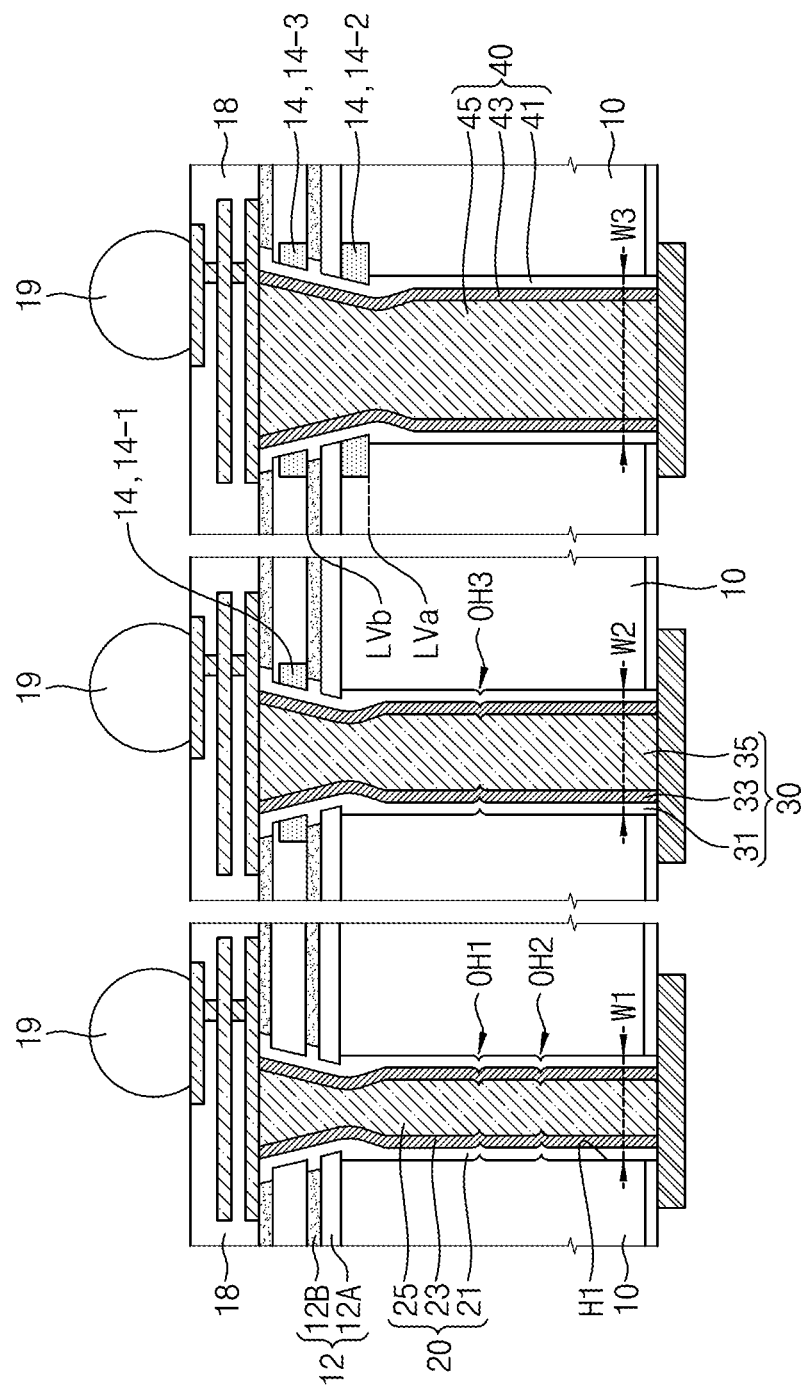
FIG. 17 is a cross-sectional view that illustrates a configuration of a part of a semiconductor device according to an example embodiment of the inventive concept.

FIG. 17 is a cross-sectional view that illustrates a configuration of a part of a semiconductor device according to an example embodiment of the inventive concept. In FIGS. 1 to 17, like reference numerals denote like elements. Hereinafter, to simplify the explanation, substantially the same or similar content as that described with reference to FIGS. 1 to 16 will be omitted.

Referring to FIG. 17, the semiconductor device may include at least three TSVs 20, 30, and 40 having different sizes. A first TSV 20 may have a first width W1, a second TSV 30 may have a second width W2, which is relatively greater than the first width, and a third TSV 40 may have a third width W3, which is relatively greater than the second width.

In an example embodiment, two overhangs OH1 and OH2 may be formed at an inner sidewall of a substrate 10, which at least partially surrounds an outer sidewall of the first TSV 20. The overhangs OH1 and OH2 may include a first overhang OH1 and a second overhang OH2 located at a lower level, i.e., vertical level in cross-sectional view, than the first overhang OH.

A third overhang OH3 may be formed at an inner sidewall of the substrate 10, which at least partially surrounds an outer sidewall of the second TSV 30. The third overhang OH3 may be located at substantially the same level, i.e., vertical level in cross-sectional view, as the first overhang OH1. The third overhang OH3 may be formed during the same process step as the first overhang OH1.

An etch stop layer 14 may include a first etch stop layer 14-1, a second etch stop layer 14-2, and a third etch stop layer 14-3. The first etch stop layer 14-1 may at least partially surround a portion of the outer sidewall of the second TSV 30 and may be disposed inside an interlayer insulating layer 12. The second etch stop layer 14-2 may at least partially surround a portion of an outer sidewall of the third TSV 40 and may be disposed in the substrate 10 so as to be in physical contact with a lower surface of the interlayer insulating layer 12. The third etch stop layer 14-3 may at least partially surround a portion of the outer sidewall of the third TSV 40 and may be disposed in the interlayer insulating layer 12 above the second etch stop layer 14-2.

FIGS. 18 to 28 are cross-sectional views schematically illustrating a method of manufacturing a semiconductor device according to an example embodiment of the inventive concept. In FIGS. 1 to 28, like reference numerals denote like elements. Hereinafter, to simplify the explanation, substantially the same or similar content as that described with reference to FIGS. 1 to 17 will be omitted.

Figure 18:
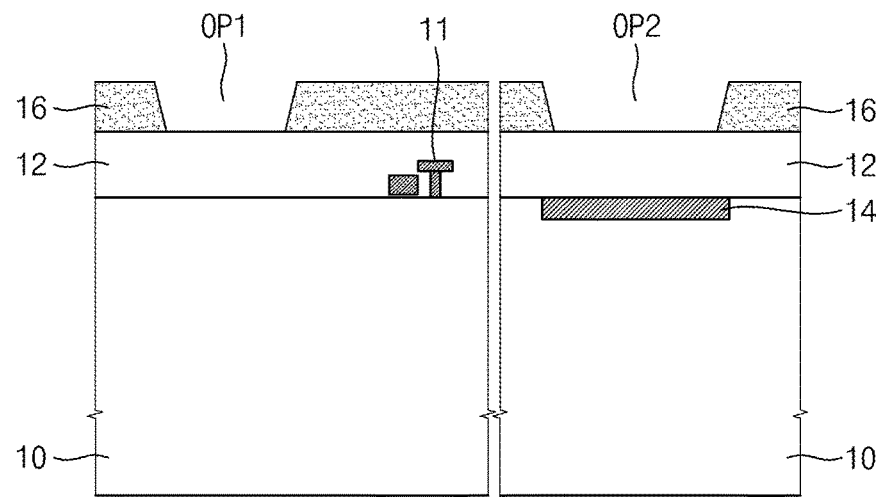
FIGS. 18 to 28 are cross-sectional views schematically illustrating a method of manufacturing a semiconductor device according to an example embodiment of the inventive concept.

Referring to FIG. 18, an etch stop layer 14 may be formed in an upper portion of a substrate 10. The etch stop layer 14 may be formed by an operation of forming various device isolation structures, such as an operation for forming a shallow trench isolation (STI) structure, in the substrate 10. In other embodiments, the etch stop layer 14 may be formed by a separate operation from the operation of forming the various device isolation structures. The etch stop layer 14 may be made of a material having an etch selectivity with respect to the substrate 10.

A FEOL structure, which includes a plurality of individual devices of various types and an interlayer insulating layer 12, may be formed on the substrate 10 and the etch stop layer 14. A mask pattern 16 may be formed on the interlayer insulating layer 12 and an open region OP in which an upper surface of the interlayer insulating layer 12 is partially exposed may be formed in the mask pattern 16. The open region may include a first open region OP1 having a relatively small size and a second open region OP2 having a relatively large size. The second open region OP2 may be located in a region corresponding to the etch stop layer 14 in a plan view. The mask pattern 16 may be a photoresist film.

Figure 19:
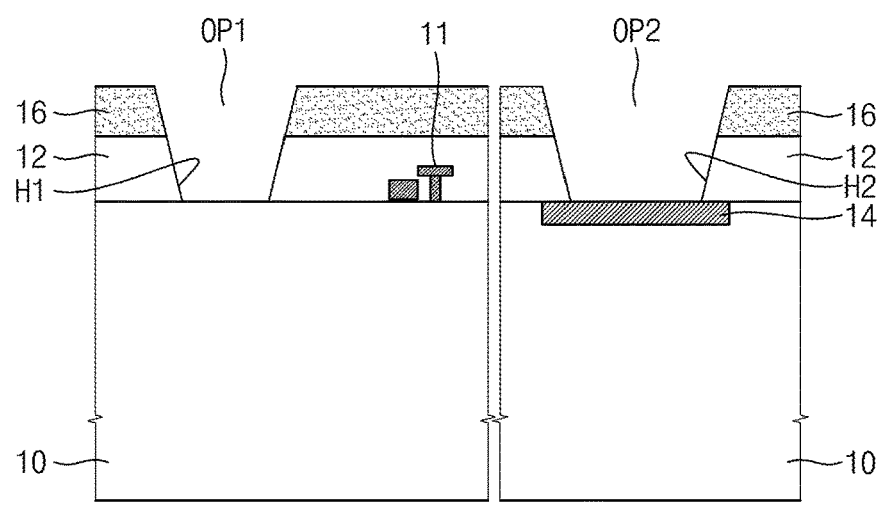

Referring to FIG. 19, the interlayer insulating layer 12 may be etched using the mask pattern 16 as an etch mask, a first through-hole H1 through which an upper surface of the substrate 10 is exposed may be formed below a first open region OP1, and a second through-hole H2 in which an upper surface of the etch stop layer 14 is exposed may be formed below second open region OP2.

Figure 20:
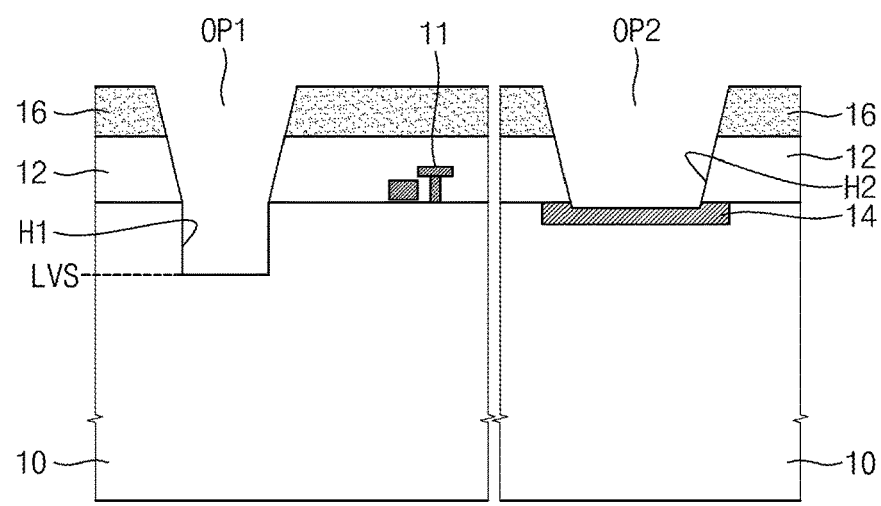

Referring to FIG. 20, the mask pattern 16 may be used as an etch mask so that the substrate 10 may be selectively etched. An upper portion of the substrate 10 may be etched so that the first through-hole H1 may extend downward to have a predetermined depth in the substrate 10. For example, an anisotropic etching process or a Bosch process may be used to form the first through-hole H1. The etch stop layer 14, which is exposed through the second through-hole H2 during the process of forming the first through-hole H1, may have an etch selectivity, and, thus, the etch stop layer 14 may not be etched or only a portion thereof may be etched. As a result, a depth LVS of the first through-hole H1 may be greater than a depth of the second through-hole H2.

In an example embodiment, although not shown in FIG. 20, during the process of forming the first through-hole H1, a sidewall of the substrate 10, which is adjacent to the interlayer insulating layer 12, may be etched to form an undercut in which a portion of a lower surface of the interlayer insulating layer 12 is exposed.

Figure 21:
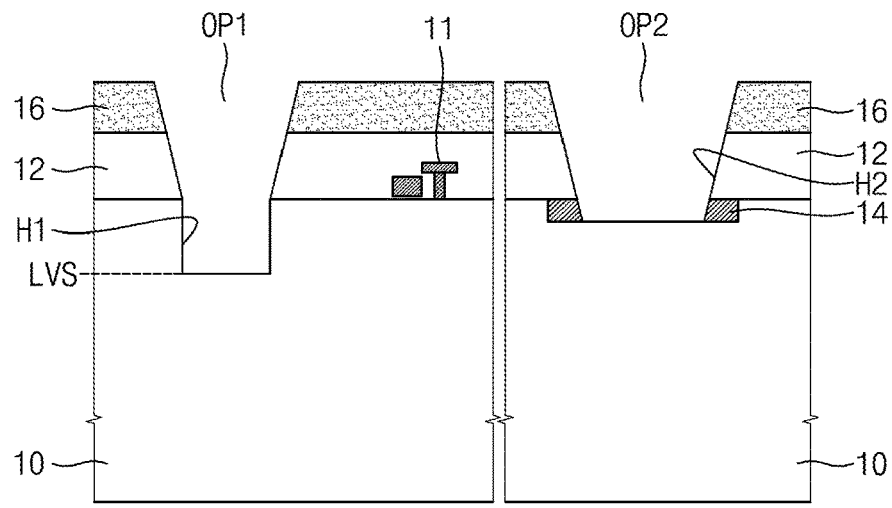

Referring to FIG. 21, the mask pattern 16 may be used as an etch mask so that the etch stop layer 14 may be selectively etched. The etch stop layer 14 may be etched through the second through-hole H2 so that the second through-hole H2 may extend downward. The etch stop layer 14 may be etched until the upper surface of the substrate 10 is exposed. The substrate 10, which is exposed through the first through-hole H1 during the process of selectively etching the etch stop layer 14, may not be etched.

Figure 22:
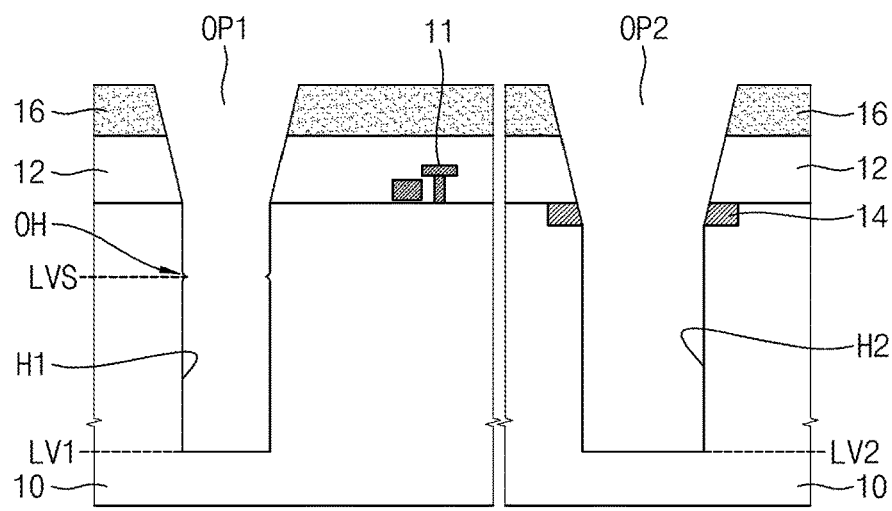

Referring to FIG. 22, the mask pattern 16 may be used as an etch mask so that the substrate 10 may be etched and the first through-hole H1 and the second through-hole H2 may extend downward. The first through-hole H1 may have a critical dimension (CD), which is relatively smaller than that of the second through-hole H2 so that an etch rate may be reduced. In an example embodiment, the substrate 10 may be etched until a depth LV1 of the first through-hole H1 becomes equal or approximately equal to a depth LV2 of the second through-hole H2. However, embodiments of the inventive concept are not limited thereto, and the depth LV1 of the first through-hole H1 may be less than or greater than the depth LV2 of the second through-hole H2. For example, an anisotropic etching process or a Bosch process may be used to extend the first through-hole H1 and the second through-hole H2 or a laser drilling technique may be used.

In an example embodiment, during the process of extending the first through-hole H1, an overhang OH may be formed at the sidewall of the substrate 10, which defines the first through-hole H1. The overhang OH may be formed at a height corresponding to the depth LVS of the first through-hole H1 as shown in FIGS. 20 and 21. In an example embodiment, the interlayer insulating layer 12 may include a multilayer structure in which a plurality of insulating layers are stacked, as shown in FIGS. 13 to 17. In this case, similar to those shown in FIGS. 13 to 17, an uneven portion may be formed at sidewalls of the interlayer insulating layer 12 exposed through the first through-hole H1 and the second through-hole H2.

Although not shown in the drawing, in an example embodiment, during the process of extending the second through-hole H2, a sidewall of the etch stop layer 14, which is adjacent to the interlayer insulating layer 12, may be etched to form an undercut in which a portion of a lower surface of the etch stop layer 14 is exposed.

Figure 23:
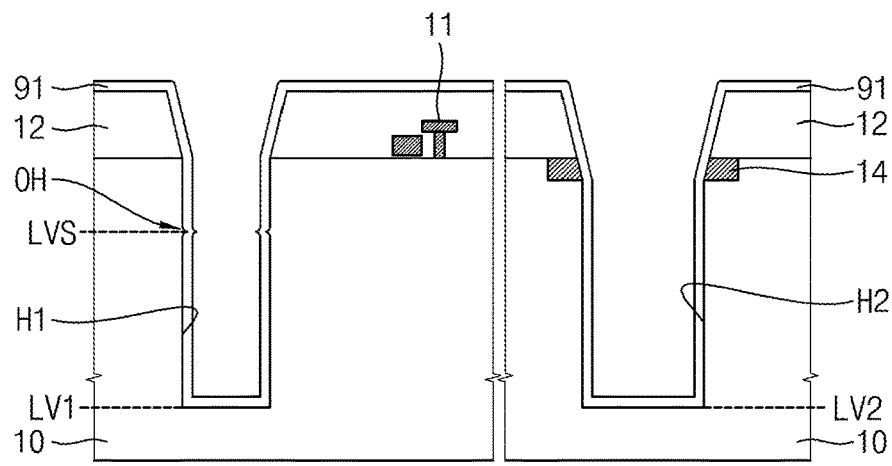

Referring to FIG. 23, a via insulating layer 91 may be formed to at least partially cover inner sidewalls and bottom surfaces of the first through-hole H1 and the second through-hole H2. The via insulating layer 91 may be formed to at least partially cover the upper surface of the interlayer insulating layer 12 and the sidewall of the interlayer insulating layer 12 exposed through the first through-hole H1 and the second through-hole H2. In an example embodiment, when an undercut is formed in a region of the first through-hole H1, in which the interlayer insulating layer 12 is adjacent to the substrate 10, and an undercut is formed in a region of the second through-hole H2, in which the etch stop layer 14 is adjacent to the substrate 10, the via insulating layer 91 may be formed to at least partially fill the undercuts, and thus the via insulating layer 91 may include a protrusion like that shown in FIG. 3 or 4.

Figure 24:
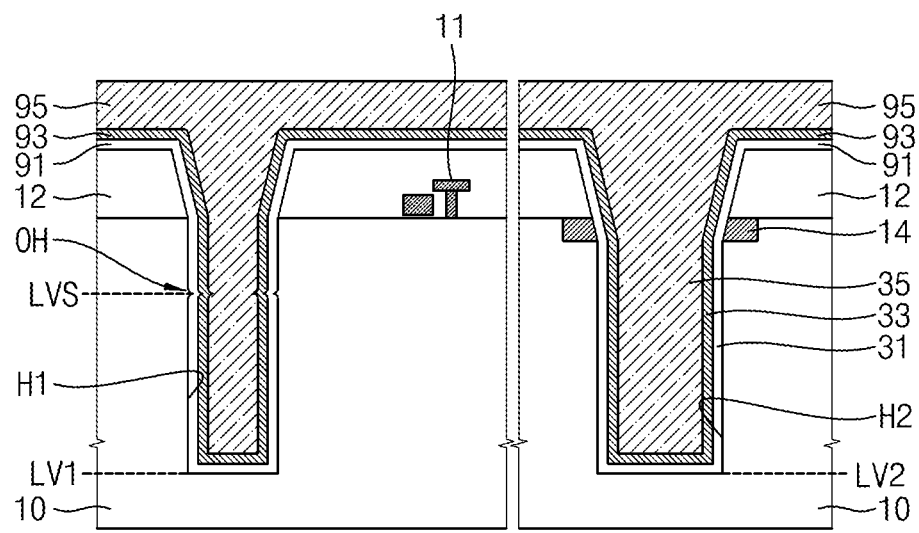

Referring to FIG. 24, a barrier layer 93 may be formed to at least partially cover the via insulating layer 91 at an inside and outside of the first through-hole H1 and the second through-hole H2. For example, the barrier layer 93 may be formed using a CVD or PVD process. In an example embodiment, the barrier layer 93 may be made of a single constituent or monolithic film made of one type of material or a multiple constituent or composite film containing at least two types of materials. In an example embodiment, the barrier layer 93 may include at least one material selected from among W, WN, WC, Ti, TiN, Ta, TaN, Ru, Co, Mn, WN, Ni, and NiB.

A plug layer 95 may be formed on the barrier layer 93 to at least partially fill the remaining space of the first through-hole H1 and the second through-hole H2. The plug layer 95 may at least partially cover the barrier layer 93 on the inside and outside of the first through-hole H1 and the second through-hole H2.

Figure 25:
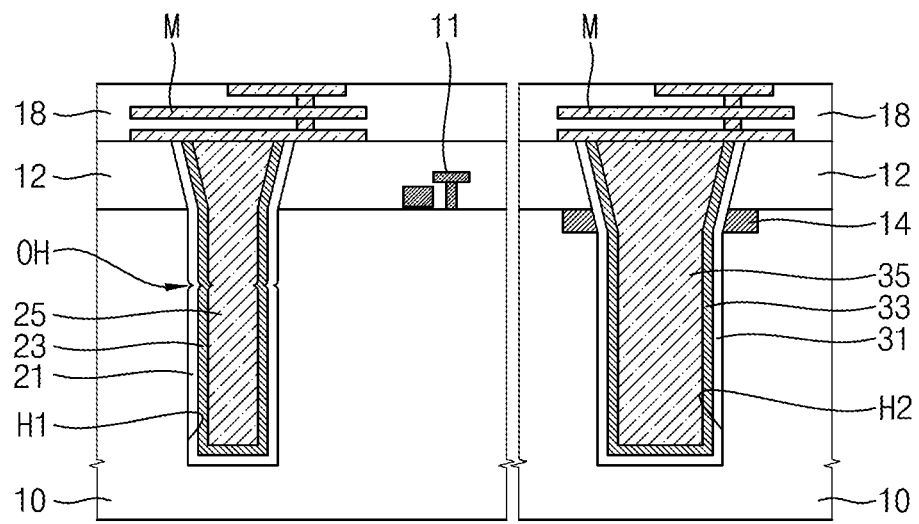
Figure 26:
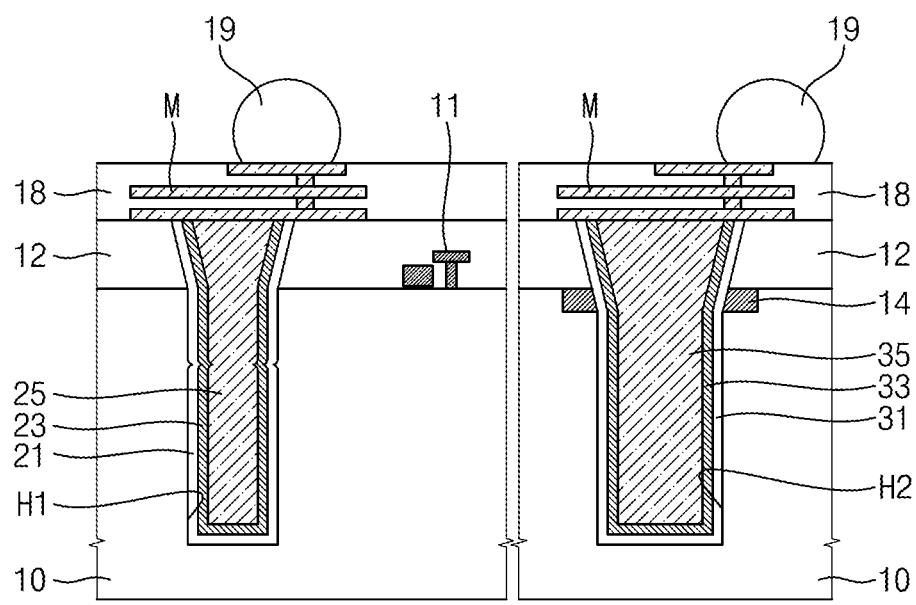

Referring to FIGS. 25 and 26, the via insulating layer 91, the barrier layer 93, and the plug layer 95 may be polished through a planarization process in which the interlayer insulating layer 12 is used as an etch stop layer, and the upper surface of the interlayer insulating layer 12 may be exposed. The via insulating layer 91, the barrier layer 93, and the plug layer 95 may have upper ends and/or surfaces at the same upper level as the upper surface of the interlayer insulating layer 12 and may remain as a first TSV 20 including a first via insulating layer 21, a first barrier layer 23, and a first plug 25, which are disposed in the first through-hole H1. In addition, the via insulating layer 91, the barrier layer 93, and the plug layer 95 may have the same upper level as the upper surface of the interlayer insulating layer 12 and may remain as a second TSV 30 including a second via insulating layer 31, a second barrier layer 33, and a second plug 35, which are disposed in the second through-hole H2.

A metal interlayer insulating layer 18 and a metal layer M may be formed on the interlayer insulating layer 12, the first TSV 20, and the second TSV 30. Connection terminals 19 connected to the metal layer M may be formed on the metal interlayer insulating layer 18.

Figure 27:
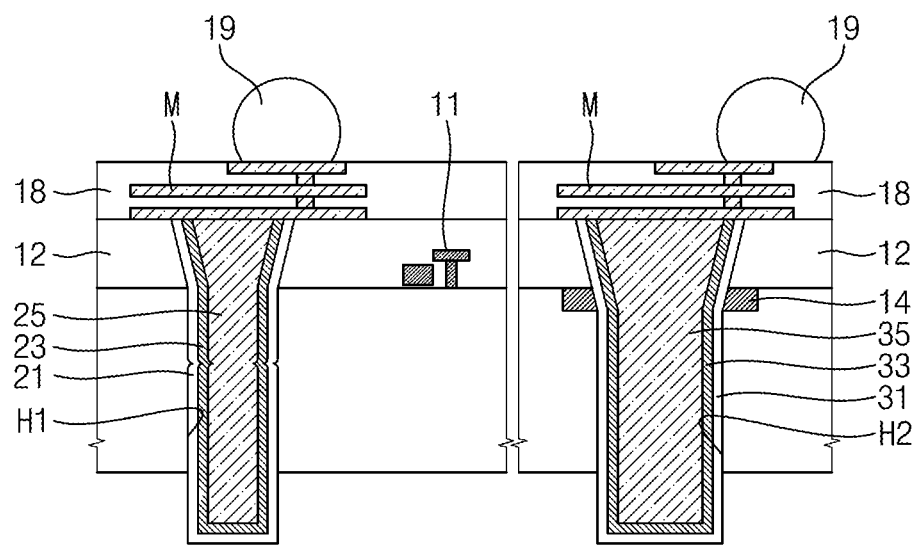

Referring to FIG. 27, the substrate 10 may be partially removed from the back surface thereof so that the first TSV 20 and the second TSV 30 may protrude from the back surface of the substrate 10.

Figure 28:
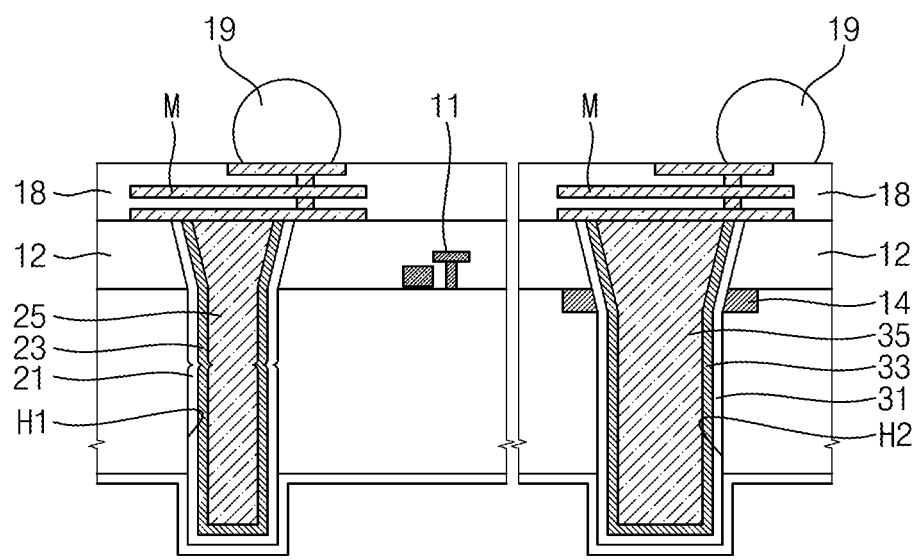

Referring to FIG. 28, a lower insulating film may be formed to at least partially cover the back surface of the substrate 10. The lower insulating film may be formed to at least partially cover the first TSV 20 and the second TSV 30 protruding from the back surface of the substrate 10. For example, the lower insulating film may include a silicon oxide film, a silicon nitride film, or a polymer.

Figure 29:
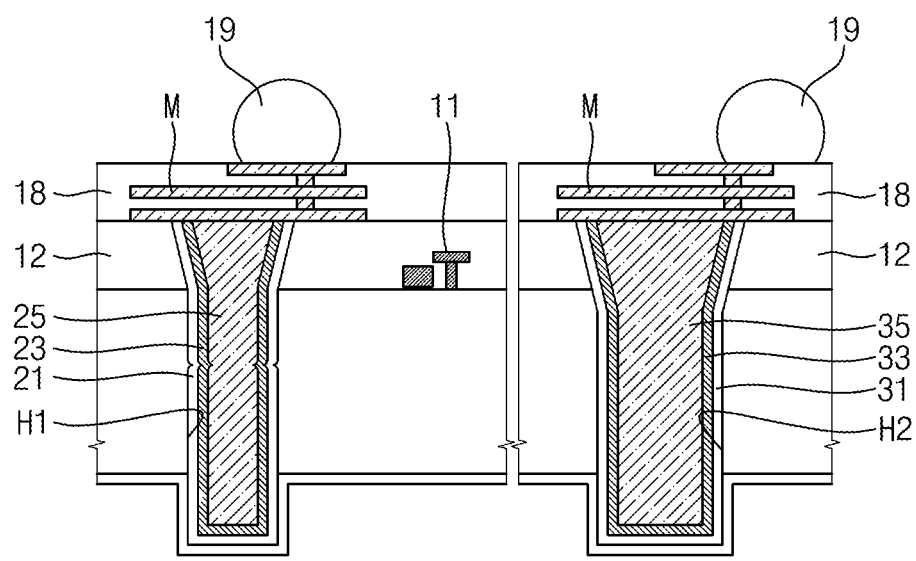
FIG. 29 is a view illustrating an intermediate process of a method of manufacturing a semiconductor device according to an example embodiment of the inventive concept.

FIG. 29 is a view illustrating an intermediate process of a method of manufacturing a semiconductor device according to an example embodiment of the inventive concept.

Referring to FIG. 29, an etch stop layer 14, which at least partially surrounds a second TSV 30, may be omitted from the semiconductor device unlike the structure of FIG. 28. For example, the etch stop layer 14 may be etched and fully removed through a planarization process during the process of forming TSVs 20 and 30. In other embodiments, the etch stop layer 14 may be fully removed by the operation of FIG. 21.

Thereafter, although not shown in the drawing, a polishing process may be performed on an exposed surface of a lower insulating film until a planarized surface is obtained at a back surface of a substrate 10. Bottom surfaces of the first TSV and the second TSV, which are planarized at the back surface of the substrate 10, may be exposed.

According to the example embodiments of the inventive concept, a TSV bending defect caused by a difference between depths of TSVs during a planarization process and the like can be reduced or prevented by adjusting the depths of TSVs having different sizes, and a decrease in yield due to the TSV bending defect can be reduced.

Figure 30A:
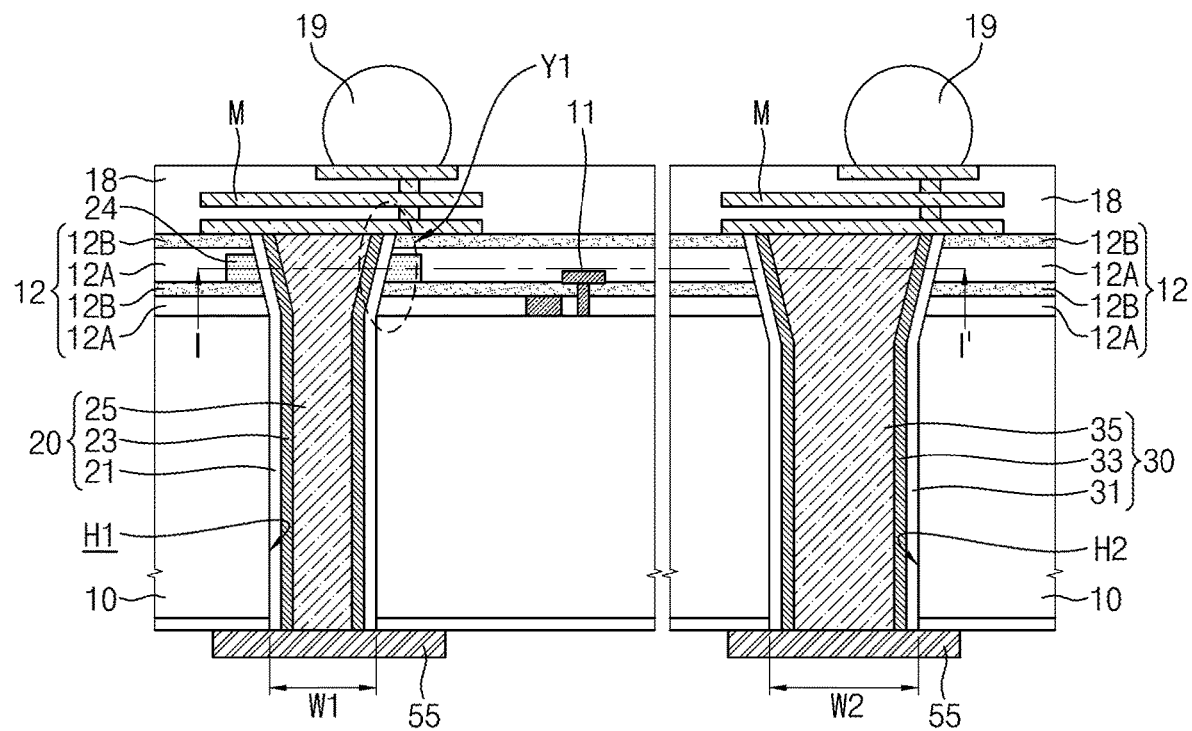
FIG. 30A is a longitudinal sectional view that illustrates a configuration of a part of a semiconductor device according to an example embodiment of the inventive concept.
Figure 30B:
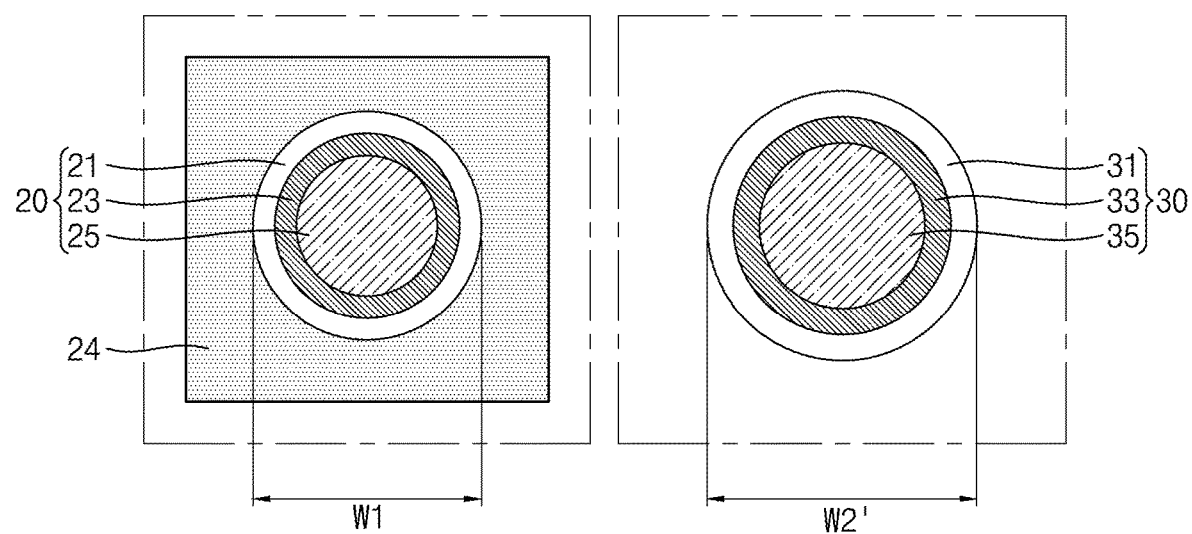
FIG. 30B is a transverse sectional view taken along line I-I' of FIG. 1A.
Figure 31:
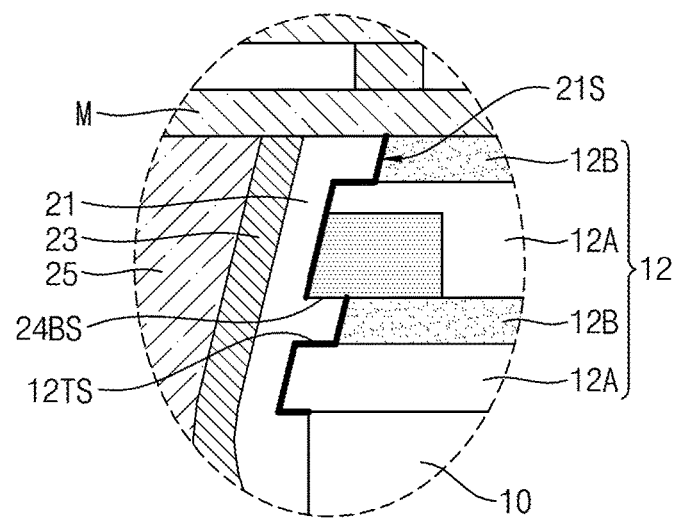
FIG. 31 is an enlarged view of a region Y1 of FIG. 1A.

FIG. 30A is a longitudinal sectional view that illustrates a configuration of a part of a semiconductor device according to an example embodiment of the inventive concept. FIG. 30B is a transverse sectional view taken along line I-I' of FIG. 30A. FIG. 31 is an enlarged view of a region Y1 of FIG. 30A.

Referring to FIGS. 30A and 30B, the semiconductor device may include a substrate 10, an interlayer insulating layer 12, a lower insulating film 13, an etch adjusting layer 24, a metal interlayer insulating layer 18, through-silicon-vias (TSV) 20 and 30, a metal layer M, and connection terminals 19 that are configured as shown.

The substrate 10 may include a semiconductor, such as silicon (Si) or germanium (Ge), or a compound semiconductor, such as silicon carbide (SiC), gallium arsenide (GaAs), indium arsenide (InAs), or indium phosphide (InP). The substrate 10 may have a silicon-on-insulator (SOI) structure in some embodiments. The substrate 10 may include a buried oxide (BOX) layer. The substrate 10 may include a conductive region, for example, a well doped with an impurity or a structure doped with an impurity. In addition, the substrate 10 may have various device isolation structures, such as a shallow trench isolation (STI) structure.

The interlayer insulating layer 12 may be disposed on the substrate 10. In an example embodiment, the interlayer insulating layer 12 may be an interlayer insulating layer included in a front-end-of-line (FEOL) structure formed on the substrate 10. In other embodiments, the interlayer insulating layer 12 may include an interlayer insulating layer included in a FEOL structure formed on the substrate 10 and an interlayer insulating layer included in a back-end-of-line (BEOL) structure formed on the FEOL structure. In an example embodiment, the interlayer insulating layer 12 may include a plurality of insulating layers stacked on the substrate 10. For example, a first interlayer insulating layer 12A and a second interlayer insulating layer 12B may be alternately stacked on the substrate 10. In FIG. 30A, a four-layer structure including four insulating layers is shown, but embodiments of the inventive concept are not limited thereto, and the number of layers to be stacked is not particularly limited.

For example, the first interlayer insulating layer 12A may include a tetraethyl orthoilicate (TEOS) film, a high-density plasma (HDP), borophosphosilicate glass (BPSG), a flowable chemical vapor deposition (FCVD) oxide, and/or an ultra-low-k (ULK) material having an ultra-low dielectric constant k of about 2.2 to 2.4. The ULK material may be made of, for example, SiOC and/or SiCOH. The second interlayer insulating layer 12B may include silicon nitride (SiN) and/or silicon oxynitride (SiON). However, embodiments of the inventive concept are not limited to the example embodiments described above.

The lower insulating film 13 may be disposed on a back surface of the substrate 10. For example, the lower insulating film 13 may include a silicon oxide film, a silicon nitride film, and/or a polymer.

The etch adjusting layer 24 may be disposed on the substrate 10. In an example embodiment, the etch adjusting layer 24 may be disposed in the interlayer insulating layer 12. For example, the etch adjusting layer 24 may be disposed in the first interlayer insulating layer 12A. A bottom surface of the etch adjusting layer 24 may be in physical contact with an upper surface of the second interlayer insulating layer 12B. A thickness of the etch adjusting layer 24 may be less than a thickness of the first interlayer insulating layer 12A. In an example embodiment, the thickness of the etch adjusting layer 24 may be greater than the thickness of the first interlayer insulating layer 12A or substantially the same as a thickness of the interlayer insulating layer 12.

The etch adjusting layer 24 may have a polygonal shape in a plan view. For example, as shown in FIG. 30B, the etch adjusting layer 24 may have a rectangular shape. In other embodiments, the etch adjusting layer 24 may have a circular shape. In an example embodiment, the etch adjusting layer 24 may include a material having an etch selectivity with respect to the interlayer insulating layer 12. For example, the etch adjusting layer 24 may include a material that is etched faster than that of the interlayer insulating layer 12 and/or the substrate 10, or may include a material that is etched slower than that of the interlayer insulating layer 12 and/or the substrate 10. The etch adjusting layer 24 may include at least one of a silicon nitride-based material, an oxide-based material, a silicon-based material (e.g., SiGe), a metal-based material, a carbon-based material, and/or a polymer material. For example, the etching control layer 14 may be made of an insulating material A plurality of individual devices (IDs) of various types may be disposed in the interlayer insulating layer 12. The IDs may include various microelectronic devices, for example, a metal-oxide-semiconductor field effect transistor (MOSFET), system large scale integration (LSI), an image sensor, such as a complementary metal-oxide-semiconductor (CMOS) imaging sensor (CIS), a micro-electro-mechanical system (MEMS), an active element, a passive element, and the like. The IDs may be electrically connected to the conductive region of the substrate 10. In addition, each of the IDs may be electrically separated from other IDs adjacent thereto by the interlayer insulating layer 12.

A plurality of through-holes H1 and H2 may be defined by the substrate 10, the interlayer insulating layer 12, and the lower insulating film 13. In an example embodiment, the plurality of through-holes H1 and H2 may have different widths (or diameters). For example, the through-holes H1 and H2 may include a first through-hole H1 having a first width W1 and a second through-hole H2 having a second width W2 greater than the first width W1 of the first through-hole H1. In an example embodiment, the first through-hole H1 may be defined by the substrate 10, the interlayer insulating layer 12, and the etch adjusting layer 24 in the interlayer insulating layer 12.

The TSVs 20 and 30 may be disposed in the through-holes H1 and H2, respectively. The TSVs 20 and 30 may be in contact with inner sidewalls of the substrate 10, the interlayer insulating layer 12, the lower insulating film 13, and the etch adjusting layer 24, which define the through-holes H1 and H2. In an example embodiment, the TSVs 20 and 30 may include a first TSV 20 and a second TSV 30 having different sizes. The first TSV 20 may be disposed in the first through-hole H1 and may pass through the substrate 10, the interlayer insulating layer 12, the lower insulating film 13, and the etch adjusting layer 24. A portion of an outer side surface of the first TSV 20 may be at least partially surrounded by an inner side surface of the etch adjusting layer 24. The second TSV 30 may be disposed in the second through-hole H2 and may pass through the substrate 10, the interlayer insulating layer 12, and the lower insulating film 13. The first TSV 20 may have the first width W1 in the substrate 10 and the second TSV 30 may have the second width W2, which is may be greater than the first width W1 in the substrate 10. The second TSV 30 may have a width that is greater than that of the first TSV 20 even in the interlayer insulating layer 12.

In some embodiments, the relatively wide second width W2 of the second TSV 30 may be 1.2 to 15 times the first width W1 of the first TSV 20. For example, the first width W1 of the first TSV 20 may be approximately 1 to 3 µm and the second width W2 of the second TSV 30 may be approximately 4 to 15 µm. In some embodiments, the second width W2 of the second TSV 30 may be 1.3 to 1.7 times the first width W1 of the first TSV 20. For example, the first width W1 of the first TSV 20 may be 1 to 3 µm and the second width W2 of the second TSV 30 may be 4 to 7 µm.

In some embodiments, when the second width W2 of the second TSV 30 is approximately 1.2 to 15 times the first width W1 of the first TSV 20, the thickness of the etching control layer 14 may be approximately 0.01 to 10 times the first width W1 of the first TSV 20. For example, when the first width W1 of the first TSV 20 is approximately 1 to 3 µm and the second width W2 of the second TSV 30 is approximately 4 to 15 µm, the thickness of etching control layer 14 may be approximately 0.01 to 1 µm. When the second width W2 of the second TSV 30 is approximately 1.3-1.7 times the first width W1 of the first TSV 20, the thickness of the etching control layer 14 is approximately 0.1 ~1 times the first width W1 of the first TSV 20. For example, when the first width W1 of the first TSV 20 is approximately 1 to 3 µm and the second width W2 of the second TSV 30 is approximately 4 to 7 µm, the thickness of the etching control layer 14 may be approximately 0.1 to 1 µm.

The first TSV 20 may include a first via insulating layer 21, a first barrier layer 23, and a first plug 25. The first via insulating layer 21, the first barrier layer 23, and the first plug 25 of the first TSV 20 may extend vertically in the first through-hole H1 to pass through the substrate 10, the interlayer insulating layer 12, the lower insulating film 13, and the etch adjusting layer 24. An outer sidewall of the first via insulating layer 21 may be in contact with the substrate 10 and the interlayer insulating layer 12. The first via insulating layer 21 may serve to separate the substrate 10 and the interlayer insulating layer 12 from the first TSV 20. For example, the first via insulating layer 21 may be made of an oxide film, a nitride film, a carbide film, a polymer, or a combination thereof. An atomic layer deposition (ALD) process or a chemical vapor deposition (CVD) process may be used to form the first via insulating layer 21.

The first barrier layer 23 may be at least partially surrounded by the first via insulating layer 21. The first barrier layer 23 may be a conductive layer having a relatively low interconnection resistance. For example, the first barrier layer 23 may be a single layer or multiple layers including at least one material selected from among W, WN, Ti, TiN, Ta, TaN, and/or Ru. The first barrier layer 23 may be formed using a physical vapor deposition (PVD) process or a CVD process. In other embodiments, the first barrier layer 23 may be formed using an ALD process.

The first plug 25 may be at least partially surrounded by the first barrier layer 23. The first plug 25 may partially or fully fill the first through-hole H1. The first plug 25 may include a metal different from that of the first barrier layer 23. For example, the first plug 25 may include at least one of Cu, W, CuSn, CuMg, CuNi, CuZn, CuPd, CuAu, and/or CuW.

The second TSV 30 may include a second via insulating layer 31, a second barrier layer 33, and a second plug 35. In an example embodiment, the second via insulating layer 31 may have the same material and the same or similar thickness as the first via insulating layer 21. The second barrier layer 33 may have the same material and the same thickness or similar as the first barrier layer 23. The second plug 35 may have the same material as the first plug 25 and may have a width greater than that of the first plug 25.

In FIG. 30B, the first TSV 20 and the second TSV 30 are shown as having a circular cross-sectional shape, but embodiments of the inventive concept are not limited thereto. For example, planar structures of the first TSV 20 and/or the second TSV 30 may have various cross-sectional shapes, such as a polygonal shape, an elliptical shape, and the like.

The metal interlayer insulating layer 18 may be disposed on the interlayer insulating layer 12. In an example embodiment, the metal interlayer insulating layer 18 may be an interlayer insulating layer included in the BEOL structure formed on the substrate 10. The metal layer M may be disposed in the metal interlayer insulating layer 18. The metal layer M may have a multilayer line structure and may be connected to the TSVs 20 and 30. The metal interlayer insulating layer 18 may further include a plurality of interconnection structures for connecting the IDs included in the FEOL structure to other interconnections. A conductive layer 55 connected to the TSVs 20 and 30 may be disposed on the lower insulating film 13.

Referring to FIG. 31, in an example embodiment, the interlayer insulating layer 12 in which insulating layers including different materials are alternately stacked may have a curved shape (an uneven shape) of which an inner side surface is curved or may have an irregular shape that includes one or more protrusions. The inner side surface may be represented as a piecewise function. An outer side surface 21S of each of the TSVs 20 and 30 in contact with the curved inner side surface of the interlayer insulating layer 12 may also have a curved shape or may include complementary protrusions to that of the interlayer insulating layer 12. The outer side surfaces 21S of the TSVs 20 and 30 may be outer side surfaces of the via insulating layers 21 and 31, respectively. In an example embodiment, the outer side surface 21S of the first TSV 20, which is in physical contact with the inner side surface of the interlayer insulating layer 12, may be in physical contact with a portion of a bottom surface 24BS of the etch adjusting layer 24. The outer side surface 21S of the first TSV 20, which is in physical contact with the inner side surface of the interlayer insulating layer 12, may be in physical contact with a portion of an upper surface 12TS of the first interlayer insulating layer 12A.

In an example embodiment, an end portion of the first interlayer insulating layer 12A, which is in physical contact with the first TSV 20, and an end portion of the second interlayer insulating layer 12B, which is in physical contact with the second TSV 30, may be positioned at different locations. For example, the end portion of the first interlayer insulating layer 12A may be located closer to the barrier layers 23 and 33 than the end portion of the second interlayer insulating layer 12B.

Figure 32A:
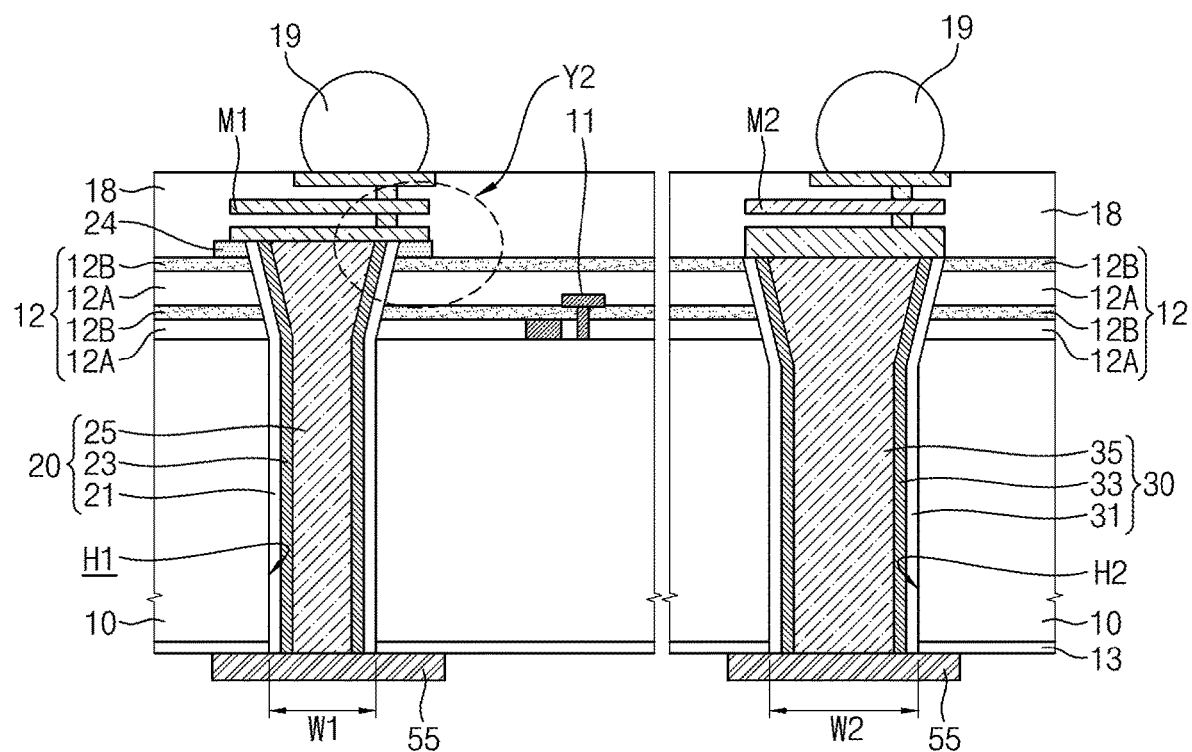
FIG. 32A is a cross-sectional view that illustrates a configuration of a part of a semiconductor device according to an example embodiment of the inventive concept
Figure 32B:
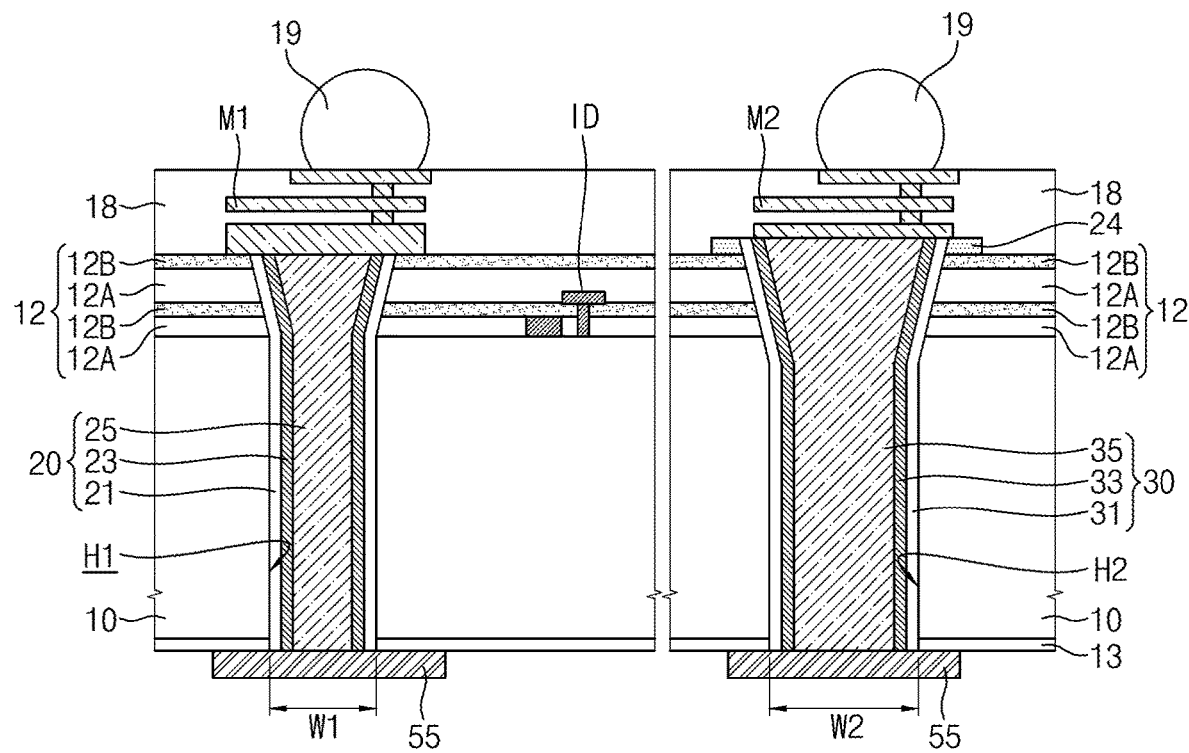
FIG. 32B is a cross-sectional view that illustrates a configuration of a part of a semiconductor device according to an example embodiment of the inventive concept.
Figure 32C:
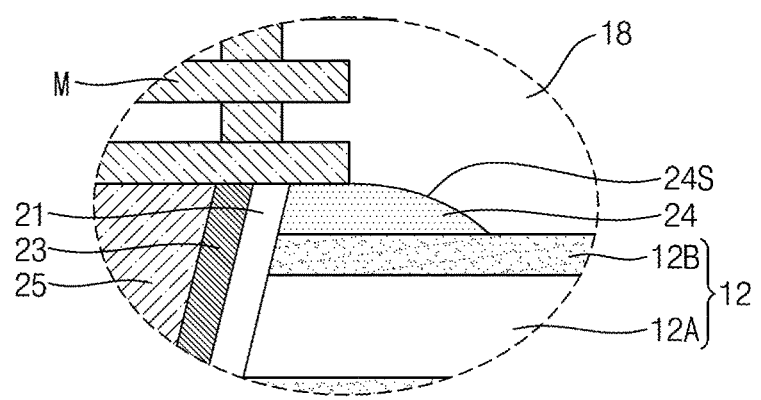
FIG. 32C is an enlarged view of a region Y2 of FIG. 2A.

FIG. 32A is a cross-sectional view that illustrates a configuration of a part of a semiconductor device according to an example embodiment of the inventive concept. FIG. 32B is a cross-sectional view that illustrates a configuration of a part of a semiconductor device according to an example embodiment of the inventive concept. FIG. 32C is an enlarged view of a region Y2 of FIG. 32A. In FIGS. 30A to 32C, like reference numerals denote like elements. Hereinafter, substantially the same content as that described with reference to FIGS. 30A to 31 will be omitted and differences therebetween will be primarily described.

Referring to FIG. 32A, an etch adjusting layer 24 may be disposed on an interlayer insulating layer 12. The etch adjusting layer 24 may be in physical contact with an upper surface of the interlayer insulating layer 12. A metal interlayer insulating layer 18 may at least partially cover the upper surface of the interlayer insulating layer 12 and a side surface and an upper surface of the etch adjusting layer 24. A first through-hole H1 may extend to an upper end of the etch adjusting layer 24 in the metal interlayer insulating layer 18. The first through-hole H1 may be formed longer (e.g., in a vertical direction in a cross-sectional view) than a second through-hole H2. A first TSV 20 may be disposed in the first through-hole H1. An upper end of the first TSV 20 may be located at substantially the same height as the upper end of the etch adjusting layer 24 (i.e., a height in a vertical direction relative to the lower insulation film 13 in a cross-sectional view). The upper end of the first TSV 20 may be located at a higher level than an upper end of the second TSV 30 (i.e., a height in a vertical direction relative to the lower insulation film 13 in a cross-sectional view). A first metal layer M1 may be disposed on the first TSV 20 and a second metal layer M2 may be disposed on the second TSV 30. In an example embodiment, the first metal layer M1 may be in physical contact with the etch adjusting layer 24. A bottom surface of the first metal layer M1 may be located at a higher level than a bottom surface of the second metal layer M2 (i.e., a height in a vertical direction relative to the lower insulation film 13 in a cross-sectional view).

Referring to FIG. 32B, an etch adjusting layer 24 may be disposed on an upper surface of an interlayer insulating layer 12 and may at least partially surround an outer side surface of a second TSV 30 having a relatively wide second width W2. The etch adjusting layer 24 at least partially surrounding the second TSV 30 may include a material having an etch selectivity different from that of the etch adjusting layer 24 surrounding the first TSV 20. For example, the etch adjusting layer 24 at least partially surrounding the second TSV 30 may function as an etch stop layer.

Referring to FIG. 32C, in an example embodiment, the etch adjusting layer 24 may extend in an outward direction from the first TSV 20 and have an inclined surface 24S having a height on an outer side lower than a height on an inner side (i.e., a height in a vertical direction relative to the lower insulation film 13 in a cross-sectional view). Even when the etch adjusting layer 24 at least partially surrounds the second TSV 30 as shown in FIG. 2B, the etch adjusting layer 24 may have an inclined surface.

Figure 33:
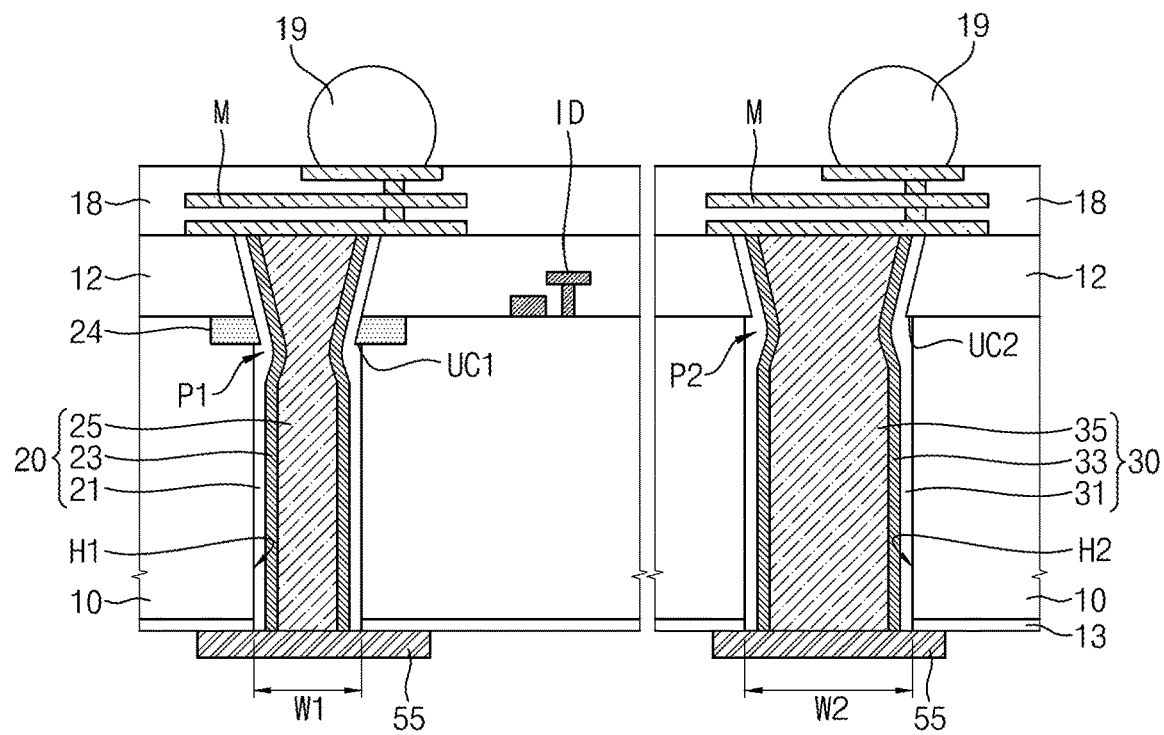
FIG. 33 is a cross-sectional view that illustrates a configuration of a part of a semiconductor device according to an example embodiment of the inventive concept.

FIG. 33 is a cross-sectional view that illustrates a configuration of a part of a semiconductor device according to an example embodiment of the inventive concept. In FIGS. 30A to 33, like reference numerals denote like elements. Hereinafter, to simplify the explanation, the same or similar content as that described with reference to FIGS. 30A to 32C will be omitted and differences therebetween will be primarily described.

Referring to FIG. 33, an etch adjusting layer 24 may be disposed on an upper portion of a substrate 10. A bottom surface and a side surface of the etch adjusting layer 24 may be in physical contact with the substrate 10 and an upper surface of the etch adjusting layer 24 and an upper surface of the substrate 10 may be substantially coplanar. The upper surface of the etch adjusting layer 24 may be in physical contact with a bottom surface of an interlayer insulating layer 12. The etch adjusting layer 24 may include a material having an etch selectivity with respect to the substrate 10. A first through-hole H1 may include a first undercut region UC1 formed below the etch adjusting layer 24 in a region in which the substrate 10 and the etch adjusting layer 24 are adjacent to each other. A second through-hole H2 may include a second undercut region UC2 formed below the interlayer insulating layer 12 in a region in which the substrate 10 and the interlayer insulating layer 12 are adjacent to each other. A first via insulating layer 21 may include a first protrusion P1, which at least partially fills the first undercut region UC1 in the first through-hole H1 and is in physical contact with a lower surface of the etch adjusting layer 24. A thickness of the first protrusion P1 in a lateral direction may be greater than a thickness of other portions of the first via insulating layer 21 in the lateral direction in a cross-sectional view as shown in FIG. 33.

A second via insulating layer 31 may include a second protrusion P2, which at least partially fills the second undercut region UC2 in the second through-hole H2 and is in physical contact with a lower surface of the interlayer insulating layer 12. A thickness of the second protrusion P2 in the lateral direction in a cross-sectional view as shown in FIG. 33 may be greater than a thickness of other portions of the second via insulating layer 31 in the lateral direction. The second protrusion P2 may be located at a different height from the first protrusion P1 (i.e., a height in a vertical direction relative to the lower insulation film 13 in a cross-sectional view). For example, the first protrusion P1 may be located farther away from the interlayer insulating layer 12 than the second protrusion P2 and disposed close to a back surface of the substrate 10 in a cross-sectional view as shown in FIG. 33.

Figure 34:
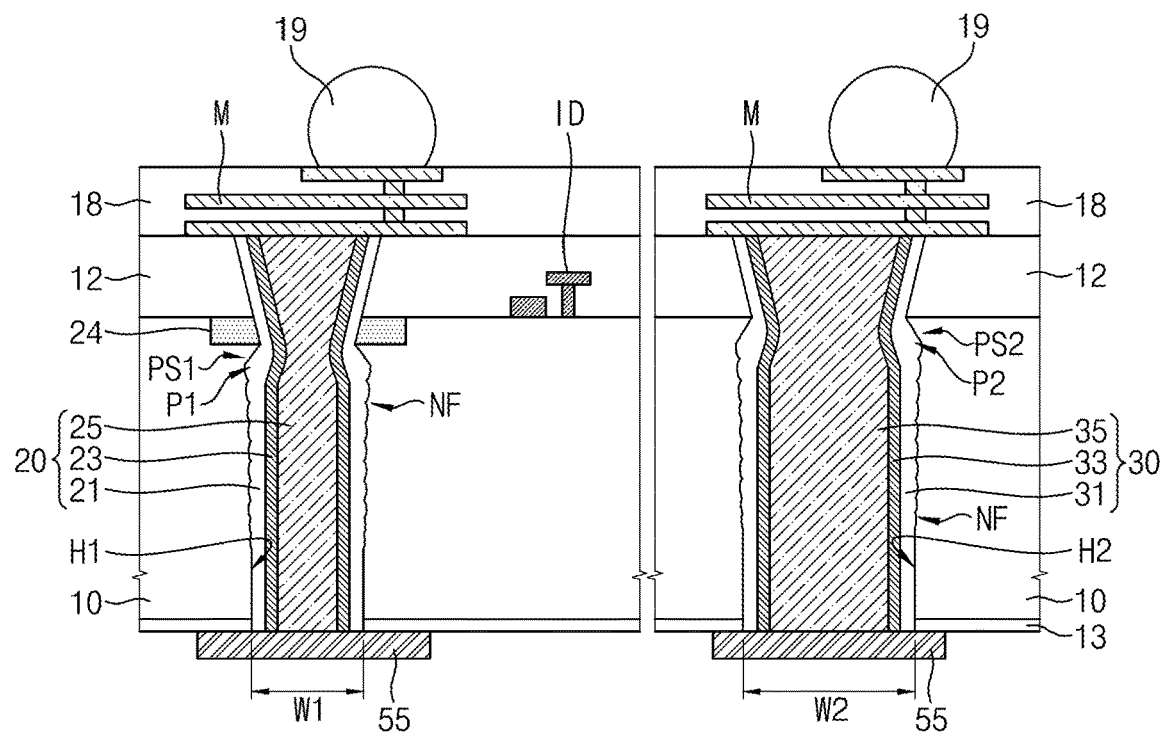
FIG. 34 is a cross-sectional view that illustrates a configuration of a part of a semiconductor device according to an example embodiment of the inventive concept.

FIG. 34 is a cross-sectional view that illustrates a configuration of a part of a semiconductor device according to an example embodiment of the inventive concept. In FIGS. 30A to 34, like reference numerals denote like elements. Hereinafter, to simplify the explanation, substantially the same or similar content as that described with reference to FIGS. 30A to 33 will be omitted and differences therebetween will be primarily described.

Referring to FIG. 34, non-flat portions NF including uneven portions may be formed at sidewalls of a substrate 10 that define TSVs 20 and 30. An outer side surface of each of via insulating layers 21 and 31 may have a non-flat portion having a shape corresponding to that of the non-flat portion NF while being in physical contact with the non-flat portion NF included in a sidewall of the substrate 10. The non-flat portion NF formed at the sidewall of the substrate 10 may be formed during a process of forming through-holes H1 and H2 in the substrate 10. In an example embodiment, the through-holes H1 and H2, which are defined by the sidewall including the non-flat portion NF, may be formed using a Bosch process. For example, to form the through-holes H1 and H2 in the substrate 10, an inductive coupled plasma deep reactive-ion etching (ICP DRIE) process using $SF_6$ or O₂ plasma and a sidewall passivation process using any one of $CF_x$ series, such as $C_4F_8$ and the like, may be repeated several times.

In an example embodiment, sizes of uneven portions formed in the non-flat portion NF, which is formed at the sidewall of the substrate 10, and sizes of uneven portions formed at outer side surfaces of the via insulating layers 21 and 31 may be reduced in a direction from a lower surface of an interlayer insulating layer 12 to a back surface of the substrate 10. For example, the non-flat portion NF formed at the sidewall of the substrate 10 may be formed in a region of the substrate 10, which is adjacent to the interlayer insulating layer 12, and a portion of the non-flat portion NF, which is adjacent to the back surface of the substrate 10, may have a generally flat surface.

The substrate 10 that defines the TSVs 20 and 30 may include protrusions PS1 and PS2, which extend to inner sides of the TSVs 20 and 30 from portions thereof adjacent to the interlayer insulating layer 12. Protrusion PS1 may be interposed between the etch adjusting layer 24 and a first protrusion P1 of a first via insulating layer 21, and the etch adjusting layer 24 and the first protrusion P1 of the first via insulating layer 21 may not be in physical contact with each other. In addition, the protrusion PS2 may be interposed between the interlayer insulating layer 12 and a second protrusion P2 of a second via insulating layer 31, and the interlayer insulating layer 12 and the second protrusion P2 of the second via insulating layer 31 may not be in physical contact with each other.

Figure 35:
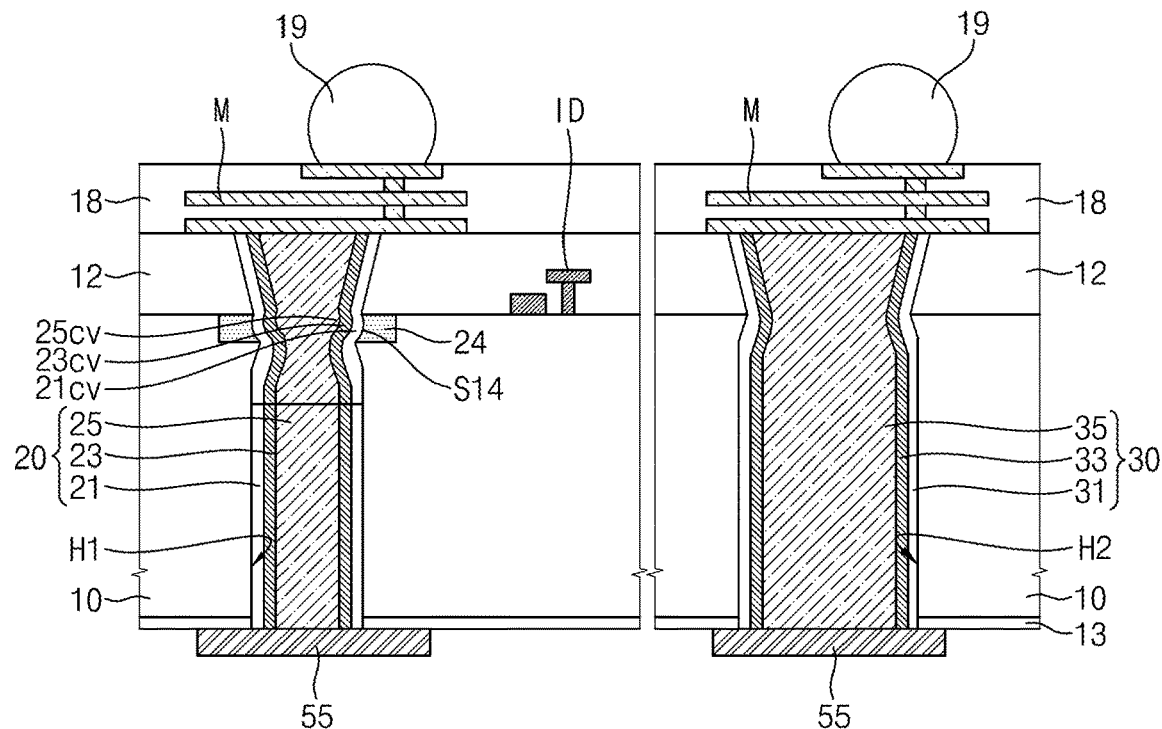
FIG. 35 is a cross-sectional view that illustrates a configuration of a part of a semiconductor device according to an example embodiment of the inventive concept.

FIG. 35 is a cross-sectional view that illustrates a configuration of a part of a semiconductor device according to an example embodiment of the inventive concept. In FIGS. 30A to 35, like reference numerals denote like elements. Hereinafter, to simplify the explanation, substantially the same content as that described with reference to FIGS. 30A to 34 will be omitted and differences therebetween will be primarily described.

Referring to FIG. 35, an inner side surface S14 of an etch adjusting layer 24, which surrounds a first TSV 20, may be concavely recessed in an outward direction of the first TSV 20. A first via insulating layer 21 may include a convex portion 21cv of which a portion in contact with the recessed inner side surface S14 of the etch adjusting layer 24 protrudes in the outward direction toward the first TSV 20. A convex portion 23cv may be formed at a portion of a first barrier layer 23 which is in physical contact with the convex portion 21cv of the first via insulating layer 21. A convex portion 25cv may be formed at a portion of a first plug 25 which is in physical contact with the convex portion 23cv of the first barrier layer 23.

Figure 36:
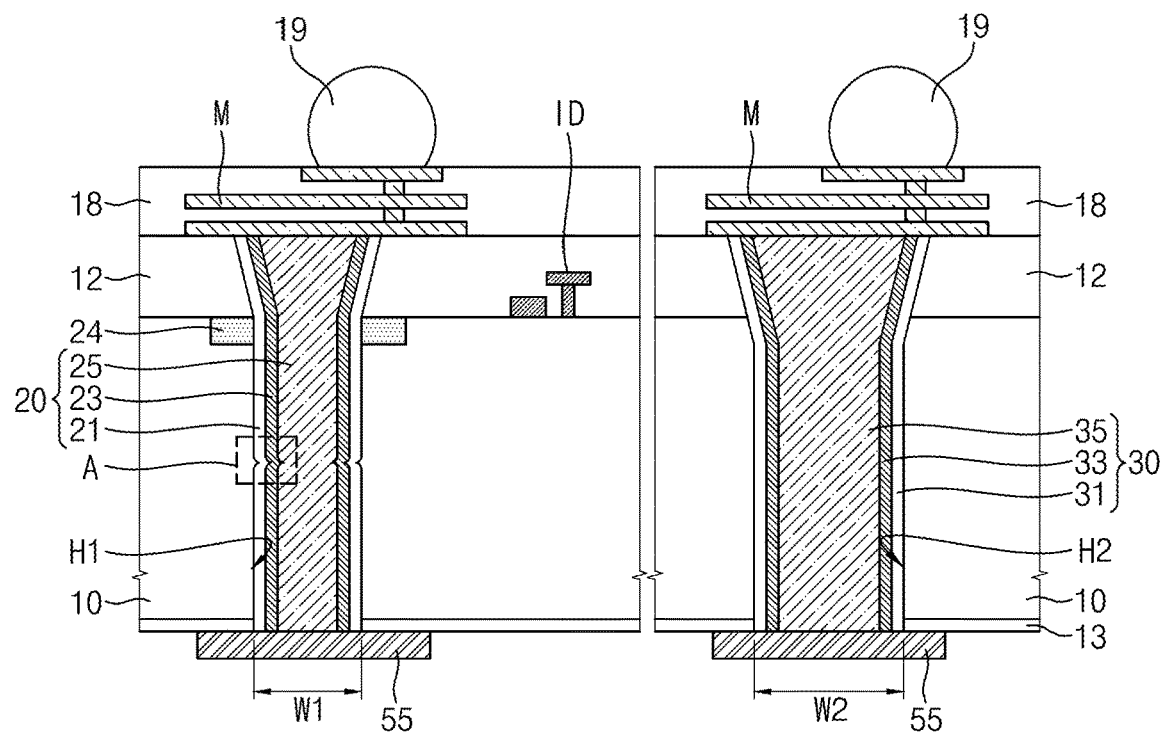
FIG. 36 is a cross-sectional view that illustrates a configuration of a part of a semiconductor device according to an example embodiment of the inventive concept.

FIG. 36 is a cross-sectional view that illustrates a configuration of a part of a semiconductor device according to an example embodiment of the inventive concept. FIG. 37 are enlarged views of a region A of FIG. 36 according to example embodiments. In FIG. 30A to 37, like reference numerals denote like elements. Hereinafter, to simplify the explanation, substantially the same or similar content as that described with reference to FIGS. 30A to 35 will be omitted and differences therebetween will be primarily described.

Referring to FIGS. 36 and 37, an overhang OH may be formed at a sidewall of a substrate 10 that at least partially surrounds a first TSV 20. The overhang OH may include a first inclined surface 51 which extends from an inward direction of the first TSV 20 from the sidewall of the substrate 10 toward a back surface of the substrate 10 and a second inclined surface S2 which extends from the inward direction of the first TSV 20 from the sidewall of the substrate 10 toward an upper surface of the substrate 10. An outer side surface of a first via insulating layer 21 may include a recessed portion having a shape corresponding to that of the overhang OH while being in physical contact with the overhang OH formed at the sidewall of the substrate 10.

In an example embodiment, referring to FIG. 37A, an inner side surface of the first via insulating layer 21 may include an overhang OH21, which extends in the inward direction of the first TSV 20 at a height corresponding to that of the recessed portion. An outer side surface of a first barrier layer 23 may include a recessed portion having a shape corresponding to that of the overhang OH21 while being in physical contact with the overhang OH21 of the first via insulating layer 21. In the same or similar manner as described above, an overhang OH23 may be formed at an inner side surface of the first barrier layer 23 and a recessed portion may be formed at an outer side surface of a first plug 25. However, embodiments of the inventive concept are not limited thereto. The first via insulating layer 21 and the first barrier layer 23 may not include overhangs OH21 and OH23 even when the substrate 10 includes the overhang OH, as shown in FIG. 37B.

Referring to FIGS. 34, 36, 37, non-flat portions NF including uneven portions may be formed at an inner sidewall of the substrate 10, which at least partially surround the TSVs 20 and 30. The overhang OH formed at the sidewall of the substrate 10 may be any one of the uneven portions of the non-flat portions NF. In an example embodiment, the overhang OH formed at the sidewall of the substrate 10 may be the largest one of the uneven portions of the non-flat portions NF.

FIGS. 38 to 43 are cross-sectional views that illustrate a configuration of a part of semiconductor devices according to example embodiments of the inventive concept. In FIGS. 30A to 43, like reference numerals denote like elements. Hereinafter, \ to simplify the explanation, substantially the same or similar content as that described with reference to FIGS. 30A to 37 will be omitted and differences therebetween will be primarily described.

Figure 43:
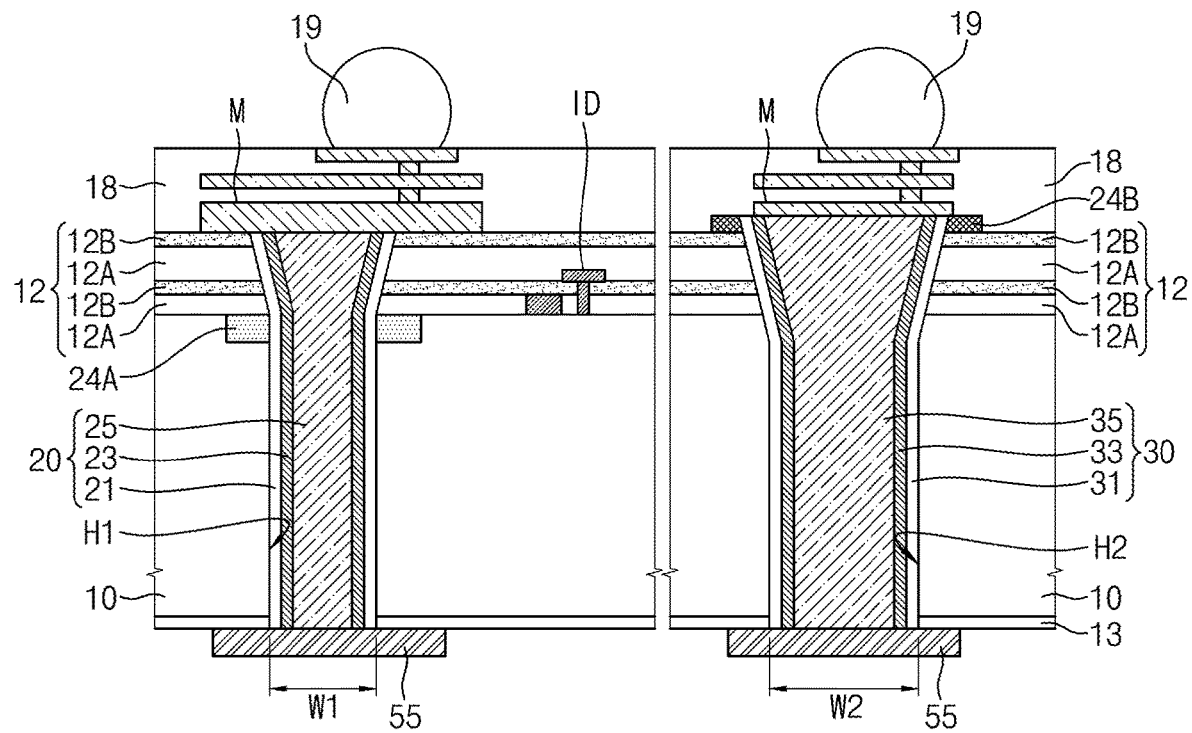

Referring to FIGS. 38 and 43, in an example embodiment, a semiconductor device may include a first etch adjusting layer 24A, which at least partially surrounds a first TSV 20 having a relatively small width and a second etch adjusting layer 24B, which surrounds a second TSV 30 having a relatively large width.

Figure 39:
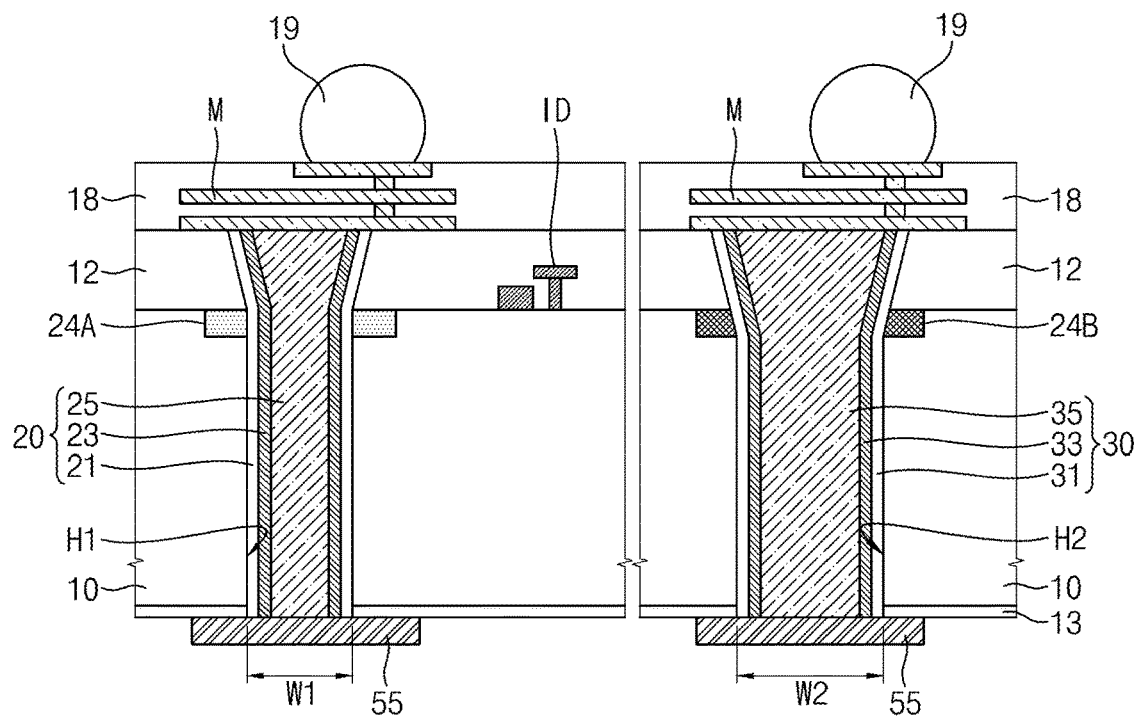

Referring to FIGS. 38 and 39, the first etch adjusting layer 24A and the second etch adjusting layer 24B may be located at the same level (i.e., a height in a vertical direction relative to the lower insulation film 13 in a cross-sectional view).

Referring to FIG. 38, in an example embodiment, the first etch adjusting layer 24A and the second etch adjusting layer 24B may be located at the same height in an interlayer insulating layer 12 (i.e., a height in a vertical direction relative to the lower insulation film 13 in a cross-sectional view). The first etch adjusting layer 24A and the second etch adjusting layer 24B may include different materials. The first etch adjusting layer 24A and the second etch adjusting layer 24B may include materials having a different etch selectivity with respect to a substrate 10 and/or the interlayer insulating layer 12. For example, the first etch adjusting layer 24A may include a material that is etched relatively faster than that of the substrate 10, the interlayer insulating layer 12, and the second etch adjusting layer 24B, that is, a material having an etching resistance relatively lower than that of the substrate 10, the interlayer insulating layer 12, and the second etch adjusting layer 24B. The second etch adjusting layer 24B may include a material that is etched relatively slower than that of the substrate 10, the interlayer insulating layer 12, and the first etch adjusting layer 24A, that is, a material having an etching resistance relatively higher than that of the substrate 10, the interlayer insulating layer 12, and the first etch adjusting layer 24A.

The thicknesses of the first etching control layer 14A (see, e.g., FIG. 15) and the second etching control layer 14B may be the same or different from each other. In one embodiment, when the second width W2 of the second TSV 30 is approximately 1.2 to 15 times the first width W1 of the first TSV 20, the second etch control layer 14B may be approximately 0.01 to 10 times the first width W1 of the first TSV 20. For example, when the first width W1 of the first TSV 20 is about 1 ~3 µm and the second width W2 of the second TSV 30 is approximately 4 ~15 µm, the second etching control layer 14B may be 0.01 to 1 µm. In some embodiments, when the second width W2 of the second TSV 30 is approximately 1.3 to 1.7 times the first width W1 of the first TSV 20, the thickness of the second etching control layer 14B May be approximately 0.1 to 1 times the first width W1 of the first TSV 20. For example, when the first width W1 of the first TSV 20 is approximately 1 to 3 µm and the second width W2 of the second TSV 30 is approximately 4 to 7 µm, the thickness of the second etching control layer 14B may have a range of approximately 0.1 ~1 µm.

Referring to FIG. 39, the first etch adjusting layer 24A and the second etch adjusting layer 24B may be located on an upper portion of the substrate 10 and below the interlayer insulating layer 12 and may be located at the substantially the same height (i.e., a height in a vertical direction relative to the lower insulation film 13 in a cross-sectional view). The first etch adjusting layer 24A and the second etch adjusting layer 24B may each have a bottom surface and an outer side surface which are in physical contact with the substrate 10 and an upper surface which is in physical contact with a bottom surface of the interlayer insulating layer 12.

Referring to FIGS. 40 to 43, the first etch adjusting layer 24A and the second etch adjusting layer 24B may be located at different levels (i.e., different levels in a vertical direction relative to the lower insulation film 13 in a cross-sectional view).

Figure 40:
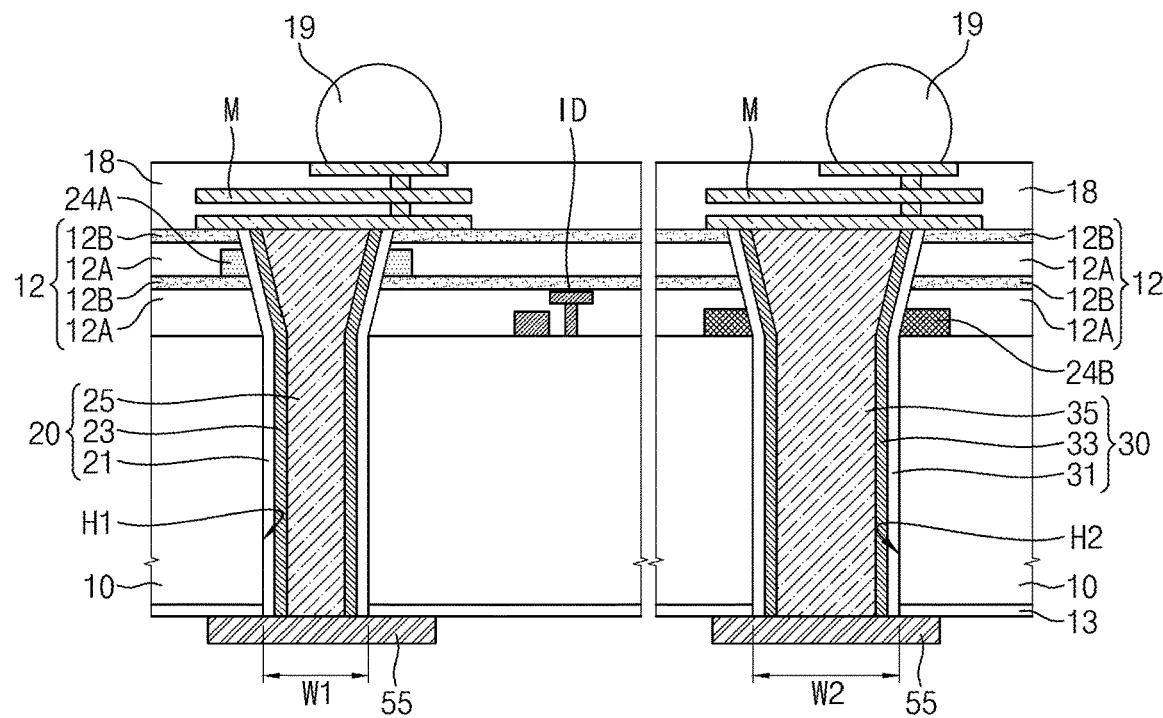

Referring to FIG. 40, in an example embodiment, the first etch adjusting layer 24A and the second etch adjusting layer 24B may be located at different levels in the interlayer insulating layer 12. A bottom surface of any one of the first etch adjusting layer 24A and the second etch adjusting layer 24B may be in physical contact with an upper surface of the substrate 10 and may be substantially coplanar with a bottom surface of the interlayer insulating layer 12. For example, the first etch adjusting layer 24A may be formed in a first interlayer insulating layer 12A on an upper side, and the second etch adjusting layer 24B may be formed in a first interlayer insulating layer 12A on a lower side.

Figure 41:
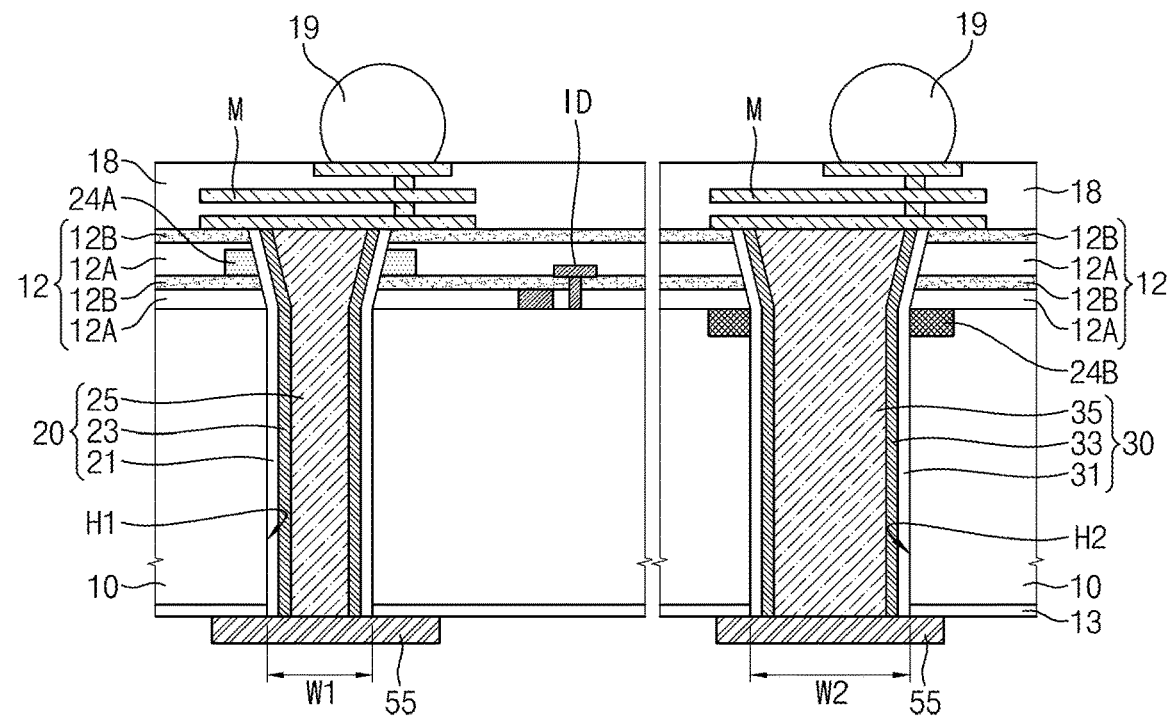

Referring to FIG. 41, in an example embodiment, one of the first etch adjusting layer 24A and the second etch adjusting layer 24B may be disposed in the interlayer insulating layer 12 and the other one may have a bottom surface and an outer side surface, which are in physical contact with the substrate 10 and an upper surface, which is in physical contact with the interlayer insulating layer 12. For example, the first etch adjusting layer 24A may be disposed in the interlayer insulating layer 12 to at least partially surround the first TSV 20, and the second etch adjusting layer 24B may be disposed on an upper portion of the substrate 10 to at least partially surround the second TSV 30 and be in physical contact with a bottom surface of the interlayer insulating layer 12. In other embodiments, the first etch adjusting layer 24A may be disposed on an upper portion of the substrate 10 to be in physical contact with the bottom surface of the interlayer insulating layer 12, and the second etch adjusting layer 24B may be disposed in the interlayer insulating layer 12.

Figure 42:
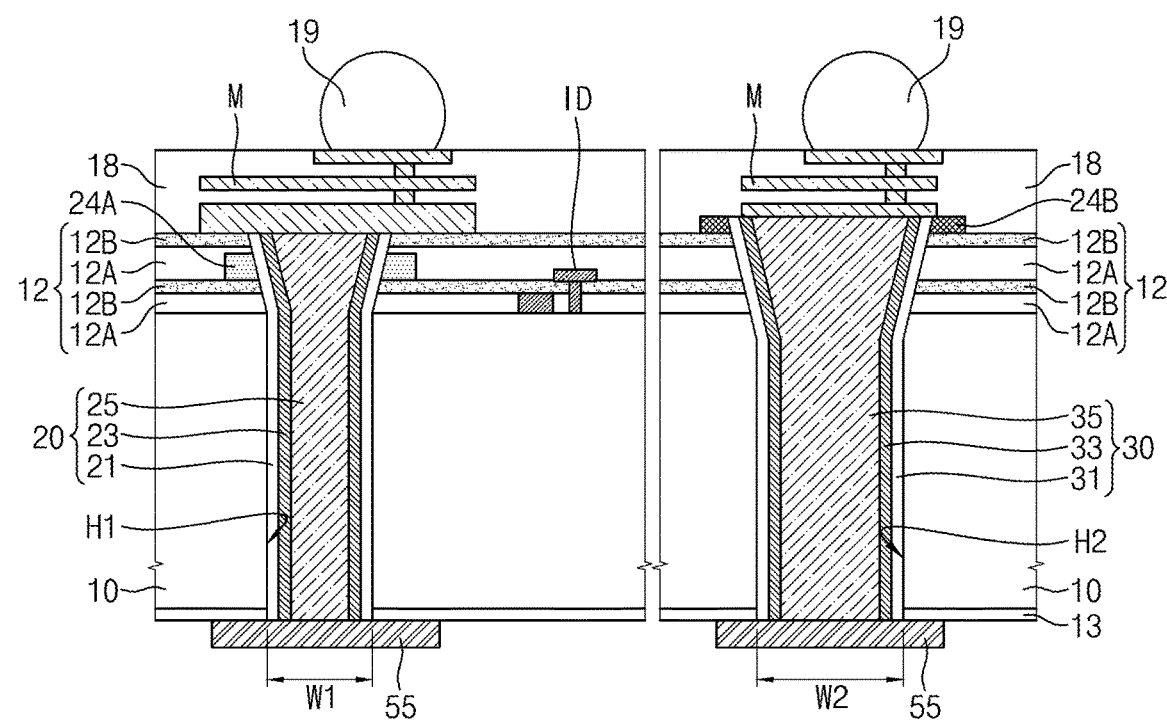

Referring to FIG. 42, in an example embodiment, one of the first etch adjusting layer 24A and the second etch adjusting layer 24B may be disposed in the interlayer insulating layer 12 and the other one may be disposed on the interlayer insulating layer 12. The first or second etch adjusting layer 24A or 14B disposed on the interlayer insulating layer 12 may be at least partially covered with the metal interlayer insulating layer 18. The first or second etch adjusting layer 24A or 14B disposed on the interlayer insulating layer 12 may be in physical contact with the metal layer M. For example, the first etch adjusting layer 24A may be disposed in the interlayer insulating layer 12 to at least partially surround a portion of the first TSV 20, and the second etch adjusting layer 24B may be disposed on the interlayer insulating layer 12 to be adjacent to the second TSV 30. In other embodiments, the first etch adjusting layer 24A may be disposed on the interlayer insulating layer 12 to be adjacent to the first TSV 20, and the second etch adjusting layer 24B may be disposed in the interlayer insulating layer 12 to at least partially surround the second TSV 30.

Referring to FIG. 43, in an example embodiment, one of the first etch adjusting layer 24A and the second etch adjusting layer 24B may be disposed below the interlayer insulating layer 12 on an upper portion of the substrate 10 and the other one may be disposed on the interlayer insulating layer 12. For example, the first etch adjusting layer 24A may at least partially surround a portion of the first TSV 20 and may be in physical contact with the substrate 10 and the interlayer insulating layer 12. The second etch adjusting layer 24B may be disposed on the interlayer insulating layer 12 to be adjacent to the second TSV 30.

FIGS. 44 to 52 are schematic cross-sectional views that illustrate a method of manufacturing a semiconductor device according to an example embodiment of the inventive concept. In FIGS. 30A to 52, like reference numerals denote like elements. Hereinafter, to simplify the explanation, substantially the same or similar content as that described with reference to FIGS. 30A to 43 will be omitted.

Figure 44:
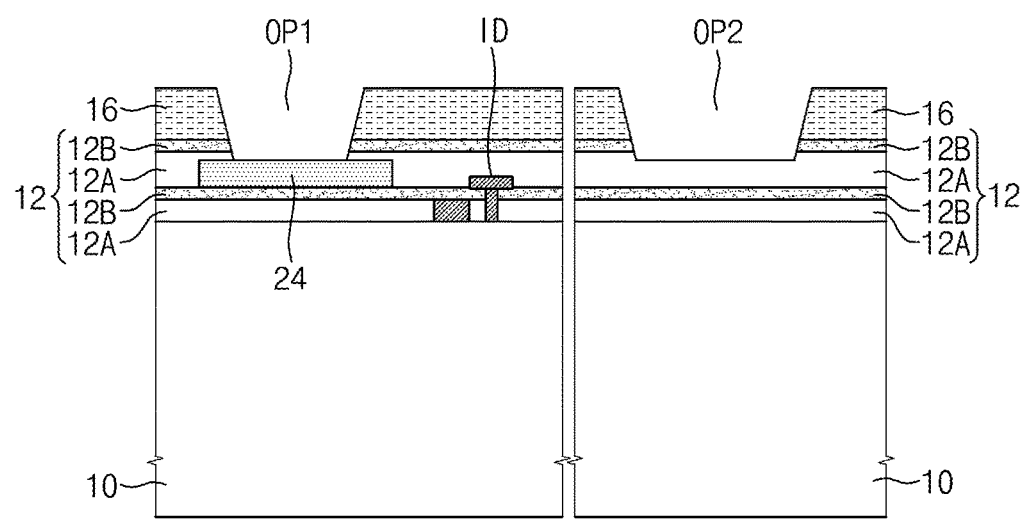
FIGS. 44 to 52 are schematic cross-sectional views illustrating a method of manufacturing a semiconductor device according to an example embodiment of the inventive concept.

Referring to FIG. 44, an FEOL structure including various types of IDs and an interlayer insulating layer 12 may be formed on a substrate 10. An etch adjusting layer 24 may be formed above the substrate 10. The etch adjusting layer 24 may be formed inside the interlayer insulating layer 12. The etch adjusting layer 24 may include a material having an etch selectivity with respect to the interlayer insulating layer 12.

A mask pattern 16 may be formed on the interlayer insulating layer 12 and open regions OP1 and OP2 configured to partially expose an upper surface of the interlayer insulating layer 12 may be formed in the mask pattern 16. The open regions OP1 and OP2 may include a first open region OP1 having a relatively small size and a second open region OP2 having a relatively large size. The first open region OP1 may overlap the etch adjusting layer 24 in a top or plan view. The mask pattern 16 may include a photoresist film or a hard mask. The interlayer insulating layer 12 may be partially etched using the mask pattern 16 as an etch mask and an upper surface of the etch adjusting layer 24 may be at least partially exposed through the first open region OP1.

Figure 45:
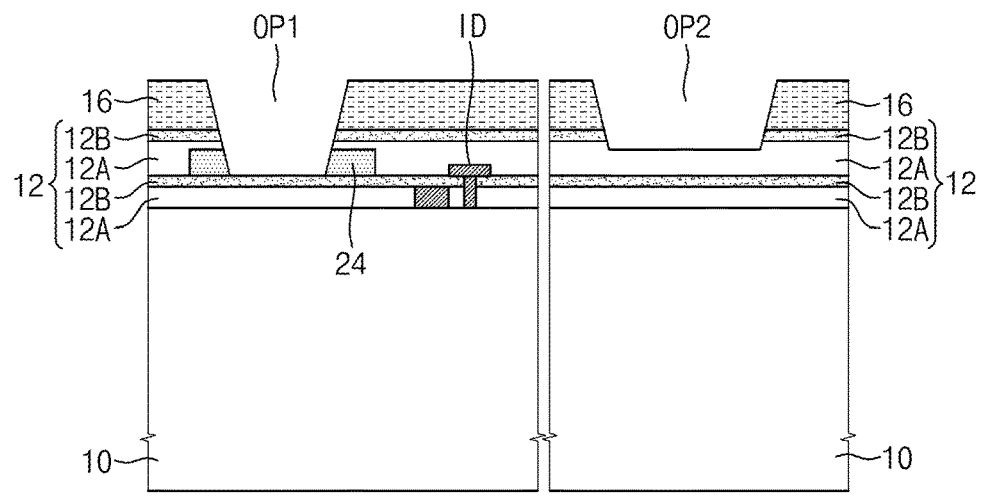

Referring to FIG. 45, the etch adjusting layer 24 may be selectively etched using the mask pattern 16 as an etch mask.

The etch adjusting layer 24 may be etched so that an upper surface of a second interlayer insulating layer 12B below the etch adjusting layer 24 may be at least partially exposed. During the process of selectively etching the etch adjusting layer 24, a first interlayer insulating layer 12A exposed through the second open region OP2 may not be etched or only partially etched because the first interlayer insulating layer 12A has an etch selectivity with respect to the etch adjusting layer 24. Accordingly, the upper surface of the interlayer insulating layer 12 at least partially exposed through the first open region OP1 may be located at a lower level (i.e., a height in a vertical direction relative to the substrate 10 being a lower reference in a cross-sectional view) than the upper surface of the interlayer insulating layer 12 at least partially exposed through the second open region OP2.

Figure 46:
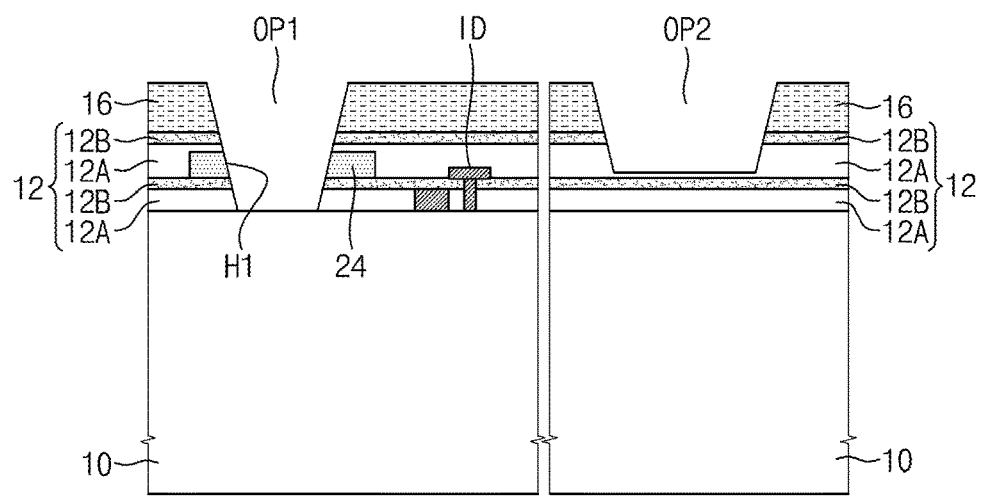

Referring to FIG. 46, the interlayer insulating layer 12, which is at least partially exposed through the first open region OP1 and the second open region OP2, may be etched using the substrate 10 as an etch stop layer. The interlayer insulating layer 12 at least partially exposed through the first open region OP1 may be etched so that an upper surface of the substrate 10 may be at least partially exposed. A first through-hole H1 through which an inner side surface of the interlayer insulating layer 12, an inner side surface of the etch adjusting layer 24, and the upper surface of the substrate 10 are at least partially exposed may be formed below the first open region OP1. The interlayer insulating layer 12 at least partially exposed through the second open region OP2 may be partially etched.

Figure 47:
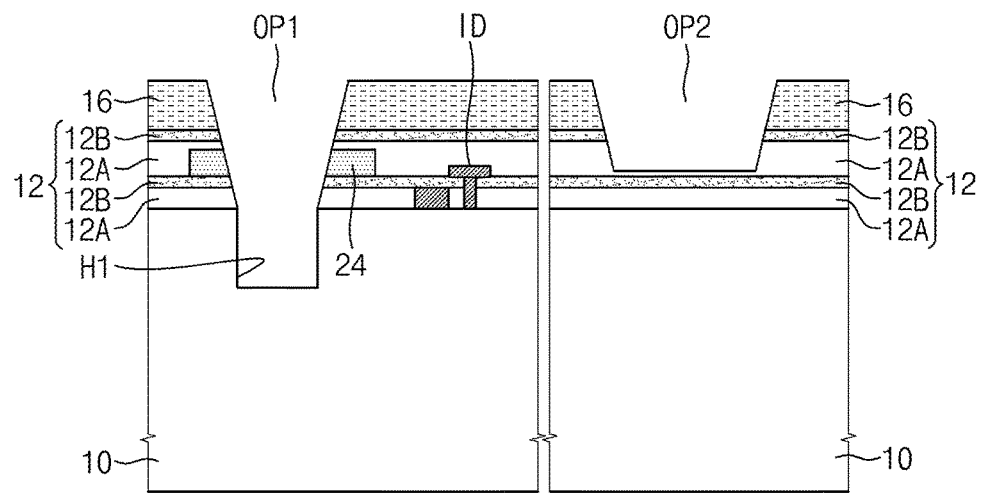

Referring to FIG. 47, the mask pattern 16 may be used as an etch mask so that the substrate 10 may be selectively etched through the first through-hole H1. An upper portion of the substrate 10 may be etched so that the first through-hole H1 extends downward to have a predetermined depth in the substrate 10. For example, an anisotropic etching process or a Bosch process may be used for the process of forming the first through-hole H1. During the process of forming the first through-hole H1, the interlayer insulating layer 12 at least partially exposed through the second open region OP2 may not be etched or only partially etched because the interlayer insulating layer 12 has an etch selectivity with respect to the substrate 10.

Figure 48:
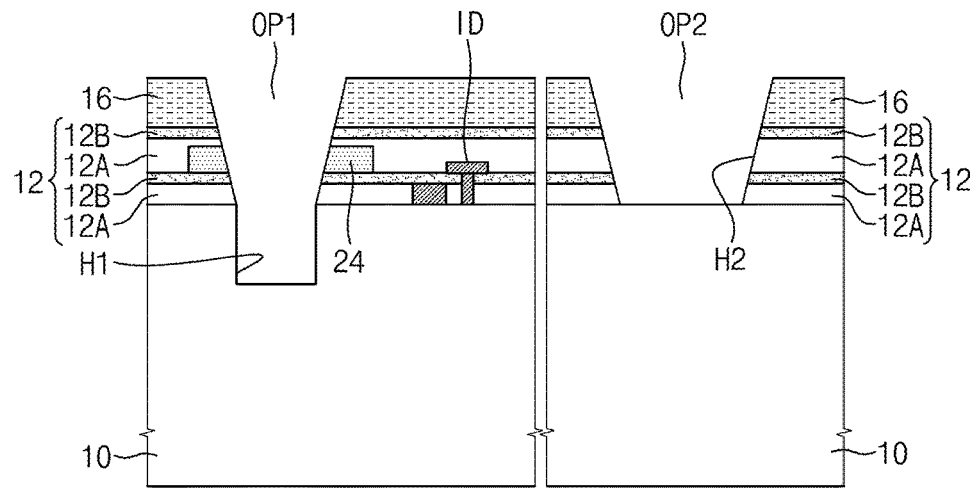

Referring to FIG. 48, the mask pattern 16 may be used as an etch mask so that the interlayer insulating layer 12 may be selectively etched. The interlayer insulating layer 12 may be etched through the second open region OP2 to form a second through-hole H2. The upper surface of the substrate 10 may be at least partially exposed through the second through-hole H2. During the process of selectively etching the interlayer insulating layer 12, the substrate 10 at least partially exposed through the first through-hole H1 may not be etched or only partially etched.

In an example embodiment, during the process of forming the first through-hole H1 and the second through-hole H2, due to a difference between etching rates of the first interlayer insulating layer 12A and the second interlayer insulating layer 12B, the interlayer insulating layer 12, which is at least partially exposed through the first through-hole H1 and the second through-hole H2, may have a curved or irregular shaped inner sidewall with lateral protrusions similar to that in FIG. 31. The inner sidewall may be represented as a piecewise function.

Figure 49:
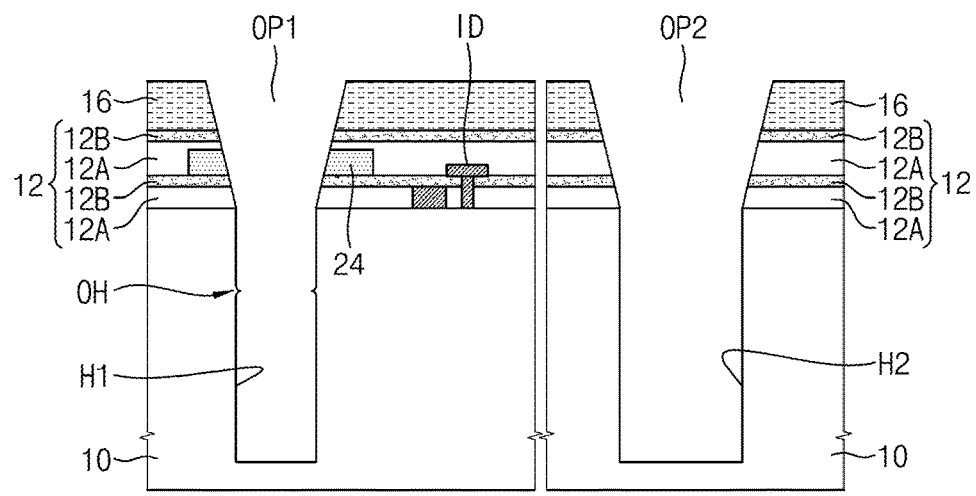

Referring to FIG. 49, the mask pattern 16 may be used as an etch mask so that the substrate 10 may be etched and the first through-hole H1 and the second through-hole H2 may extend downward into the substrate 10. Because the first through-hole H1 has a relatively smaller width than the second through-hole H2, an etch rate of the substrate 10 exposed through the first through-hole H1 may be relatively smaller than an etch rate of the substrate 10 exposed through the second through-hole H2. In an example embodiment, the substrate 10 may be etched until a depth of the first through-hole H1 becomes substantially equal to a depth of the second through-hole H2. However, embodiments of the inventive concept are not limited thereto, and the depth of the first through-hole H1 may be smaller than or greater than the depth of the second through-hole H2. For example, an anisotropic etching process or a Bosch process, or a laser drilling technique may be used for the process of extending the first through-hole H1 and the second through-hole H2.

In an example embodiment, during the process of extending the first through-hole H1, an overhang OH may be formed at a sidewall of the substrate 10 that defines the first through-hole H1. The overhang OH may be formed at a level corresponding to the depth of the first through-hole H1 in FIG. 18.

In an example embodiment, during the process of extending the first through-hole H1 and the second through-hole H2, the sidewall of the substrate 10 adjacent to the interlayer insulating layer 12 may be etched so that a undercut in which a portion of a lower surface of the substrate 10 is exposed may be formed.

Figure 50:
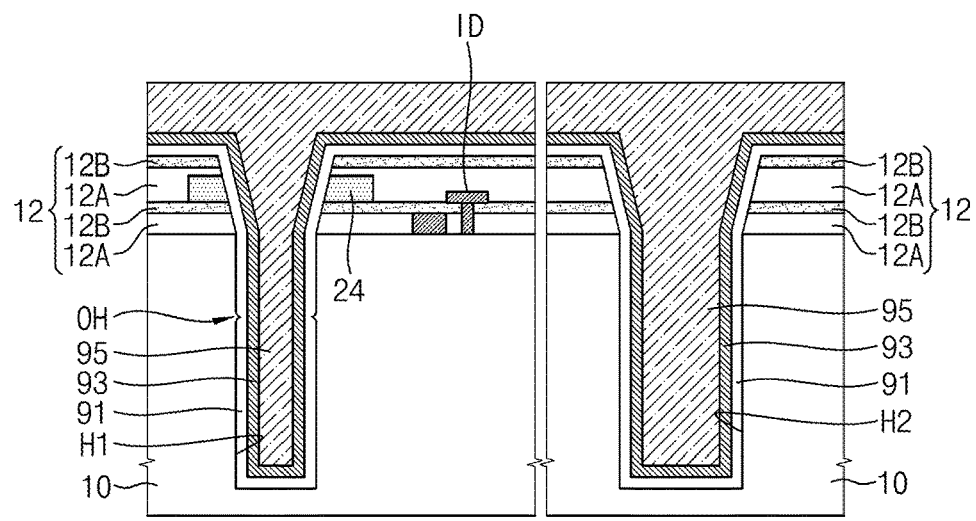

Referring to FIG. 50, the mask pattern 16 may be removed so that a via insulating layer 91, which at least partially covers inner side walls and bottom surfaces of the first through-hole H1 and the second through-hole H2 may be formed. The via insulating layer 91 may be formed to at least partially cover the upper surface of the interlayer insulating layer 12 and the sidewall of the interlayer insulating layer 12 exposed through the first through-hole H1 and the second through-hole H2. A barrier layer 93 may be formed to at least partially cover the via insulating layer 91 at an inside and outside of the first through-hole H1 and the second through-hole H2. For example, the barrier layer 93 may be formed using a CVD or PVD process. In an example embodiment, the barrier layer 93 may be made of a single or monolithic film made of one type of material or a multiple film containing at least two types of materials. In an example embodiment, the barrier layer 93 may include at least one material selected from among W, WN, WC, Ti, TiN, Ta, TaN, Ru, Co, Mn, WN, Ni, and/or NiB. A plug layer 95 may be formed on the barrier layer 93 to at least partially fill the remaining space of the first through-hole H1 and the second through-hole H2. The plug layer 95 may at least partially cover the barrier layer 93 on the inside and outside of the first through-hole H1 and the second through-hole H2.

Figure 51:
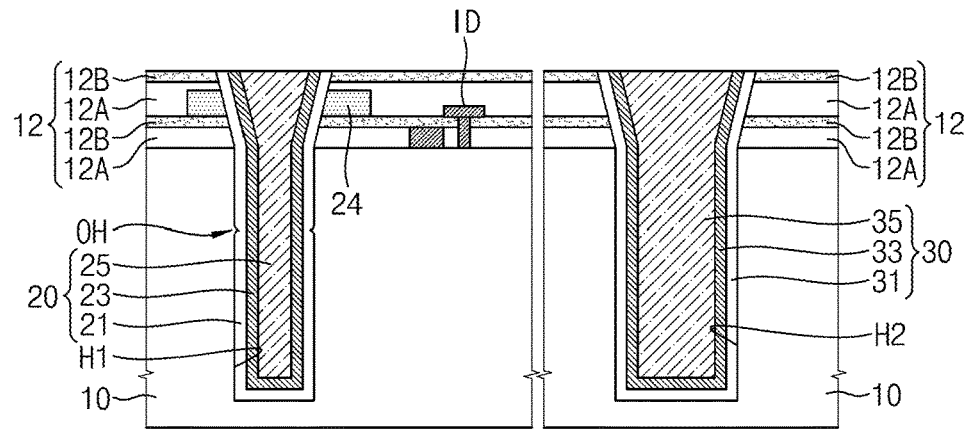

Referring to FIG. 51, the via insulating layer 91, the barrier layer 93, and the plug layer 95 may be polished through a planarization process in which the interlayer insulating layer 12 is used as an etch stop layer, and the upper surface of the interlayer insulating layer 12 may be at least partially exposed. The via insulating layer 91, the barrier layer 93, and the plug layer 95 may have an upper end at the same upper level as the upper surface of the interlayer insulating layer 12 and may remain as a first TSV 20 including a first via insulating layer 21, a first barrier layer 23, and a first plug 25, which are disposed in the first through-hole H1. In addition, the via insulating layer 91, the barrier layer 93, and the plug layer 95 may have an upper end at the same upper level as the upper surface of the interlayer insulating layer 12 and may remain as a second TSV 30 including a second via insulating layer 31, a second barrier layer 33, and a second plug 35, which are disposed in the second through-hole H2.

Figure 52:
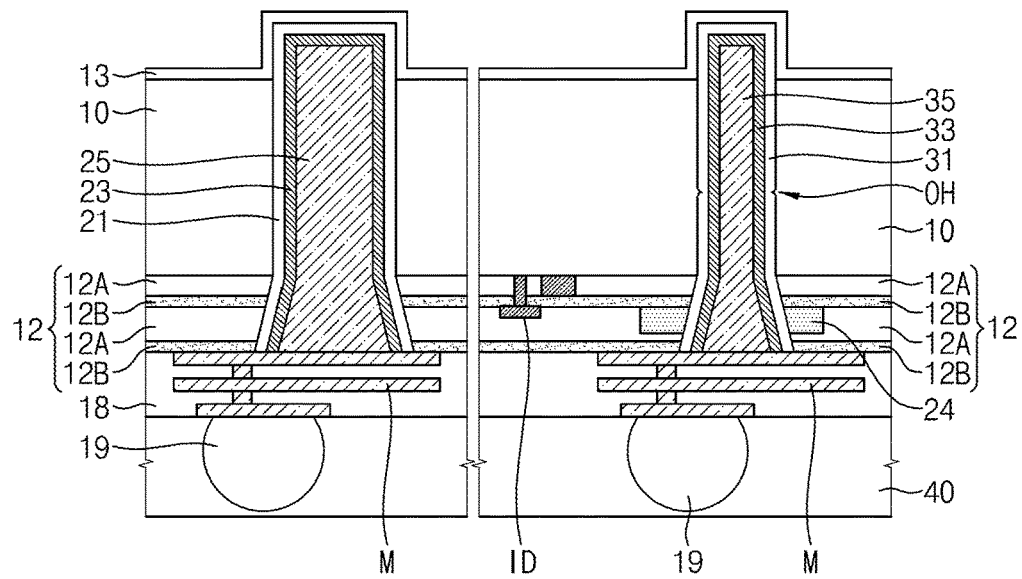

Referring to FIG. 52, a metal layer M, a metal interlayer insulating layer 18, and a connection terminal 19 may be formed on the interlayer insulating layer 12, the first TSV 20, and the second TSV 30. The connection terminal 19 may be a solder ball formed using a bump process. A support 40 may be attached onto the substrate 10 so as to at least partially cover the connection terminal 19, and the substrate 10 may be partially removed from a back surface thereof in a state in which the substrate 10 is turned upside down. The first TSV 20 and the second TSV 30 may protrude from a back surface of the substrate 10. A lower insulating film 13 may be formed to at least partially cover the back surface of the substrate 10. The lower insulating film 13 may be formed to at least partially cover the first TSV 20 and the second TSV 30 protruding from the back surface of the substrate 10. A polishing process may be performed on an exposed surface of the lower insulating film 13 until a planarized surface is obtained at the back surface of the substrate 10. Bottom surfaces of the first TSV 20 and the second TSV 30, which are planarized at the back surface of the substrate 10, may be at least partially exposed.

Figure 53:
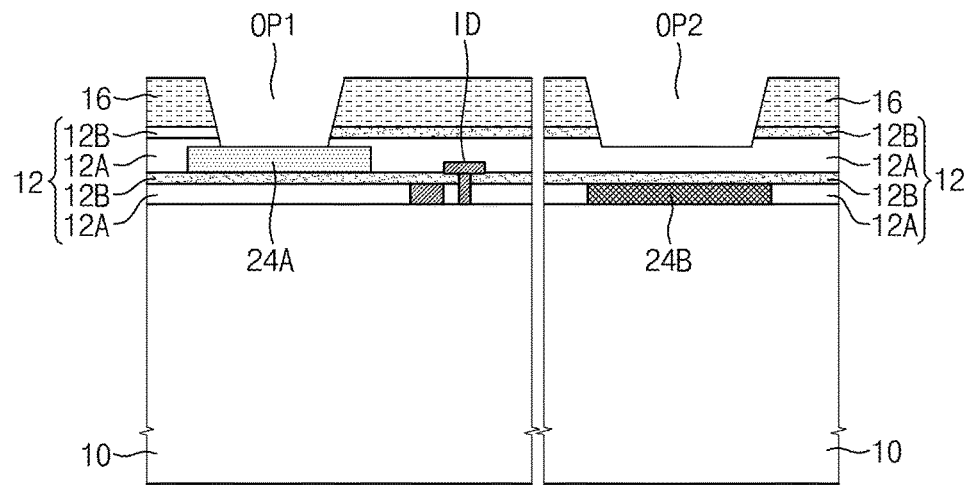
FIGS. 53 to 55 are schematic cross-sectional views illustrating a method of manufacturing a semiconductor device according to an example embodiment of the inventive concept.
Figure 54:
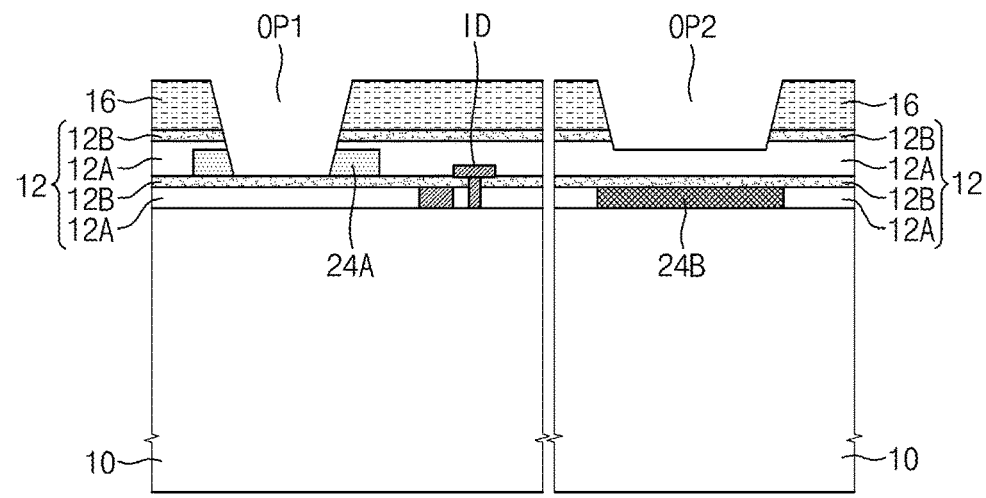
Figure 55:
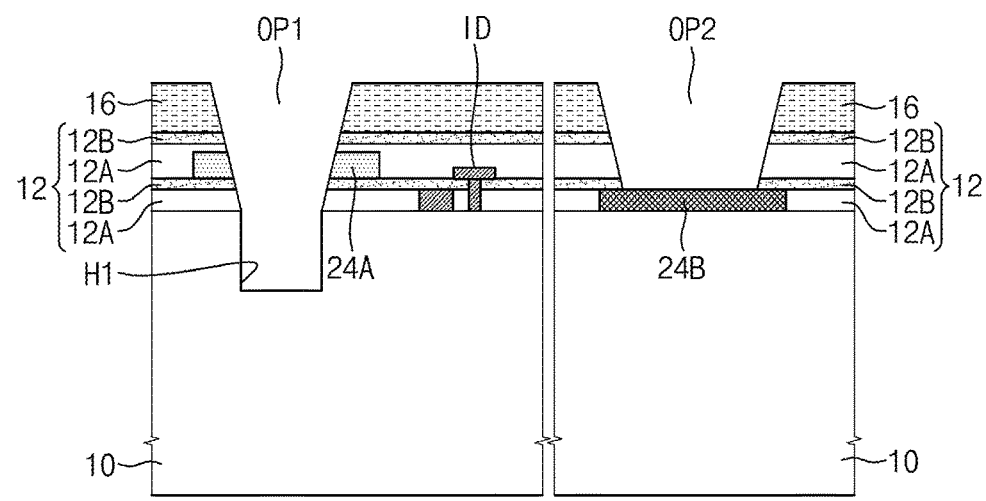

FIGS. 53 to 55 are schematic cross-sectional views that illustrate a method of manufacturing a semiconductor device according to an example embodiment of the inventive concept. In FIGS. 30A to 55, like reference numerals denote like elements. Hereinafter, to simplify the explanation, substantially the same or similar contents as those described with reference to FIGS. 30A to 52 will be omitted and differences therebetween will be primarily described.

Referring to FIG. 53, a first etch adjusting layer 24A and a second etch adjusting layer 24B may be formed on the substrate 10. The first etch adjusting layer 24A may be formed inside the interlayer insulating layer 12. The first etch adjusting layer 24A and the second etch adjusting layer 24B may be formed at different levels. For example, the first etch adjusting layer 24A may be located at a higher level than the second etch adjusting layer 24B (i.e., a height in a vertical direction relative to the substrate 10 being a lower reference point in a cross-sectional view). The first etch adjusting layer 24A and the second etch adjusting layer 24B may include different materials. The first etch adjusting layer 24A and the second etch adjusting layer 24B may each have an etch selectivity relative to the substrate 10 and/or the interlayer dielectric layer 12, the first etch adjusting layer 24A may include a material having a relatively high etch rate, and the second etching control layer 14B may include a material having a relatively low etch rate.

A mask pattern 16 is formed on the interlayer insulating layer 12. The mask pattern 16 is formed with a first open region OP1 on the first etch adjusting layer 24A and a second open region OP2 on a second etch adjusting layer 24B. The first open region OP1 may have a relatively narrower size than the second open region OP2.

The interlayer insulating layer 12 is partly etched using the mask pattern 16 as an etching mask and the first etch adjusting layer 24A can be exposed through the first open region OP1.

Referring to FIG. 54, the first etch adjusting layer 24A may be selectively etched. The first etch adjusting layer 24A is etched to at least partially expose the upper surface of the second interlayer insulating layer 12B under the first etch adjusting layer 24A.

Referring to FIG. 55, the interlayer insulating layer 12 may be etched through the first open region OP1 and the second open region OP2. The interlayer insulating layer 12 can be etched through the second open region OP2 using the second etch adjusting layer 24B as an etching stop layer. The second open region OP2 may extend downward until the upper surface of the second etch adjusting layer 24B is at least partially exposed. The interlayer insulating layer 12 and the substrate 10 may be etched through the first open region OP1 to form the first through-hole H1. Because the second etch adjusting layer 24B has an etching selectivity with respect to the interlayer insulating layer 12 and/or the substrate 10, the second etch adjusting layer 24B may not be etched while the first through-hole H1 is formed.

Thereafter, the upper surface of the substrate 10 may be at least partially exposed by etching the second etch adjusting layer 24B through the second open region OP2. The second open region OP2 may extend downward to at least partially expose the substrate 10 and a second through-hole H2 having a shallower depth than the first through-hole H1 may be formed. Thereafter, the same or similar processes as those described in FIGS. 48 to 52 are performed, and semiconductor devices as shown in FIG. 40 can be formed. The semiconductor devices shown in FIGS. 41 to 43 may also be formed in a manner similar to that described above.

Figure 56:
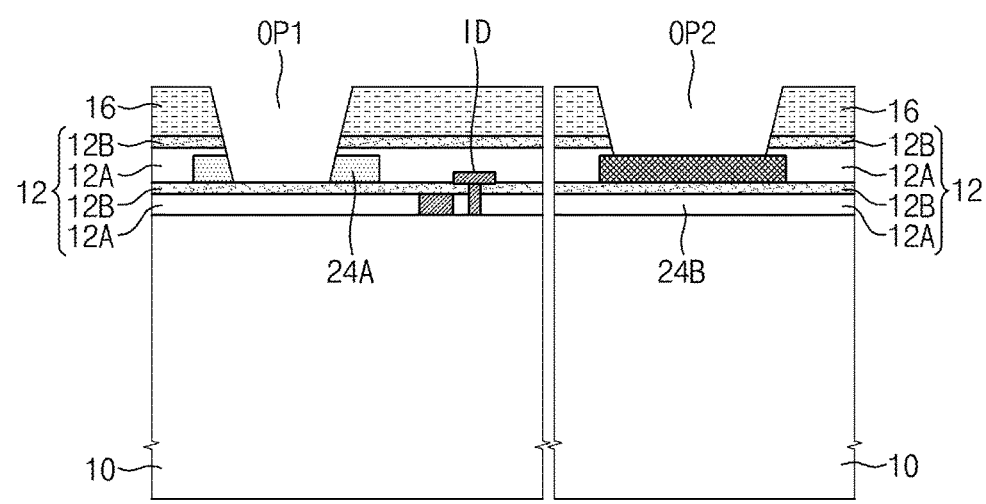
FIG. 56 is schematic cross-sectional view illustrating a method of manufacturing a semiconductor device according to an example embodiment of the inventive concept.

FIG. 56 is schematic cross-sectional view that illustrates a method of manufacturing a semiconductor device according to an example embodiment of the inventive concept.

Referring to FIG. 56, the first etch adjusting layer 24A and the second etch adjusting layer 24B may be located at the same level. In this case as well, similar to that described in FIGS. 44 to 52, the depths of the through-holes having different widths can be adjusted in the same way using a first etch adjusting layer 24A including a material having a higher etch rate and a second etch adjusting layer 24B including a material having a lower etch rate. The first etching adjusting layer 14A is first etched through the first open region OP1 and then the same or similar processes as those described with reference to FIG. 55 and FIGS. 49 to 52 are performed, and the semiconductor device as shown in FIG. 38 can be formed.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. A method of manufacturing a semiconductor device, the method comprising:
    forming an etch stop layer in an upper portion of a substrate;
    forming a FEOL structure including an interlayer insulating layer on the substrate and the etch stop layer;
    forming a mask pattern including a first open region and a second open region wider than the first open region on the interlayer insulating layer, the second open region vertically overlapping the etch stop layer;
    forming a first preliminary through hole and a second preliminary through hole by using the mask pattern as an etch mask, the second preliminary through hole exposing the etch stop layer, the first preliminary through hole is deeper than the second preliminary through hole;
    forming a first through hole and a second through hole by extending the first preliminary through hole and the second preliminary through hole in a downward direction using the mask pattern as an etch mask; and forming a first TSV in the first through hole and a second TSV in the second through hole.

2. The method of claim 1, wherein the forming the first preliminary through hole and the second preliminary through hole by using the mask pattern as the etch mask comprises:
   forming a first preliminary through hole exposing an upper surface of the substrate through the first open area and forming a second preliminary through hole exposing an upper surface of the etch stop layer through the second open area;
   etching the substrate through the first open region to extend the first preliminary through hole in the downward direction.

3. The method of claim 2, wherein the etch stop layer is not etched or only partially etched while the first preliminary through-hole is extended in the downward direction by etching the substrate through the first open region.

4. The method of claim 2, wherein the forming the first preliminary through hole and the second preliminary through hole by using the mask pattern as the etch mask comprises:
   extending the second preliminary through hole in the downward direction by selectively etching the etch stop layer.

5. The method of claim 1, wherein the first through hole and the second through hole have substantially the same depth.

6. The method of claim 1, wherein the etch stop layer includes a material having an etch selectivity with respect to the substrate.

7. The method of claim 1, wherein the first open area does not vertically overlap the etch stop layer.

8. The method of claim 1, wherein the forming the first TSV in the first through hole and the second TSV in the second through hole comprises:
   removing the mask pattern; and
   forming a via insulating layer, a barrier layer, and a plug layer in the first through hole and the second through hole.

9. The method of claim 1, wherein an overhang is formed on a sidewall of the substrate defining the first through hole.

10. A method of manufacturing a semiconductor device, the method comprising:
   forming an etch adjusting layer and an interlayer insulating layer on the substrate;
   forming a mask pattern including a first open region and a second open region wider than the first open region on the interlayer insulating layer, the first open region vertically overlapping the etch adjusting layer;
   forming a first preliminary through hole and a second preliminary through hole by using the mask pattern as an etch mask, the first preliminary through hole exposes the etch adjusting layer and is deeper than the second preliminary through hole;
   forming a first through hole and a second through hole by extending the first preliminary through hole and the second preliminary through hole in a downward direction using the mask pattern as an etch mask; and
   forming a first TSV in the first through hole and a second TSV in the second through hole.

11. The method of claim 10, wherein the etch adjusting layer is located inside the interlayer insulating layer.

12. The method of claim 10, wherein the etch adjusting layer includes a material having an etch selectivity with respect to the interlayer insulating layer.

13. The method of claim 10, wherein the forming the first preliminary through hole and the second preliminary through hole by using the mask pattern as the etch mask comprises:
   partially etching the interlayer insulating layer through the first open region and the second open region, the first open region exposes an upper surface of the etch adjusting layer; and
   selectively etching the etch adjusting layer through the first open region.

14. The method of claim 13, wherein the forming the first preliminary through hole and the second preliminary through hole by using the mask pattern as the etch mask further comprises:
   etching the substrate through the first open region to extend the first preliminary through-hole in the downward direction.

15. The method of claim 14, wherein the forming the first preliminary through hole and the second preliminary through hole by using the mask pattern as the etch mask further comprises:
   forming the second preliminary through hole by etching the interlayer insulating layer through the second open region.

16. A method of manufacturing a semiconductor device, the method comprising:
   forming a first etch adjusting layer, a second etch adjusting layer, and an interlayer insulating layer on the substrate;
   forming a mask pattern including a first open region and a second open region wider than the first open region on the interlayer insulating layer, the first open region vertically overlaps the first etch adjusting layer and the second open region vertically overlaps the second etch adjusting layer;
   forming a first preliminary through-hole and a second preliminary through-hole by using the mask pattern as an etch mask, the first preliminary through hole exposes the first etch adjusting layer, and the second preliminary through hole exposes the second etch adjusting layer, and the first preliminary through hole is deeper than the second preliminary through hole;
   forming a first through hole and a second through hole by extending the first preliminary through hole and the second preliminary through hole in a downward direction using the mask pattern as an etch mask; and
   forming a first TSV in the first through hole and a second TSV in the second through hole.

17. The method of claim 16, wherein the forming the first preliminary through hole and the second preliminary through hole by using the mask pattern as the etch mask comprises:
   partially etching the interlayer insulating layer through the first open region and the second open region, the first open region exposes an upper surface of the etch control layer; and
   selectively etching the etch adjusting layer through the first open region.

18. The method of claim 17, wherein the second open region exposes an upper surface of the second etch adjusting layer.

19. The method of claim 16, wherein the first etch adjusting layer and the second etch adjusting layer are located at different levels.

20. The method of claim 16, wherein the first etch control layer and the second etch control layer are located at the same level.

\* \* \* \* \*